(12) United States Patent
Lee et al.

(10) Patent No.: US 12,278,145 B2
(45) Date of Patent: Apr. 15, 2025

(54) SEMICONDUCTOR DEVICES WITH A SOURCE/DRAIN BARRIER LAYER AND METHODS OF MANUFACTURE

(71) Applicant: Taiwan Semiconductor Manufacturing Co., Ltd., Hsinchu (TW)

(72) Inventors: Chien-Wei Lee, Kaohsiung (TW); Chii-Horng Li, Zhubei (TW); Bang-Ting Yan, Hsinchu (TW); Bo-Yu Lai, Taipei (TW); Wei-Yang Lee, Taipei (TW); Chia-Pin Lin, Xinpu Township (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 307 days.

(21) Appl. No.: 17/460,528

(22) Filed: Aug. 30, 2021

(65) Prior Publication Data

US 2023/0064735 A1 Mar. 2, 2023

(51) Int. Cl.
*H01L 21/8234* (2006.01)
*H01L 27/088* (2006.01)
*H01L 29/06* (2006.01)
*H01L 29/423* (2006.01)
*H01L 29/78* (2006.01)
*H01L 29/786* (2006.01)

(52) U.S. Cl.
CPC ........ *H01L 21/823418* (2013.01); *H01L 21/823412* (2013.01); *H01L 21/823431* (2013.01); *H01L 27/0886* (2013.01); *H01L 29/0665* (2013.01); *H01L 29/42392* (2013.01); *H01L 29/785* (2013.01); *H01L 29/78696* (2013.01)

(58) Field of Classification Search
CPC ..... H01L 21/823412; H01L 21/823418; H01L 21/823425; H01L 21/823431; H01L 27/0886; H01L 29/0665; H01L 29/0673; H01L 29/0847; H01L 29/1079; H01L 29/161; H01L 29/165; H01L 29/42392; H01L 29/66439; H01L 29/66545; H01L 29/775; H01L 29/7848; H01L 29/785; H01L 29/78696
See application file for complete search history.

(56) References Cited

U.S. PATENT DOCUMENTS 9,209,247 B2 12/2015 Colinge et al.
9,236,267 B2 1/2016 De et al.
(Continued)

*Primary Examiner* — Cheung Lee
(74) *Attorney, Agent, or Firm* — Slater Matsil, LLP

(57) ABSTRACT

Semiconductor devices and methods of fabricating the semiconductor devices are described herein. The method includes steps for patterning fins in a multilayer stack and forming an opening in a fin as an initial step in forming a multilayer source/drain region. The opening is formed into a parasitic channel region of the fin. Once the opening has been formed, a source/drain barrier material is deposited using a bottom-up deposition process at the bottom of the opening to a level below the multilayer stack. A multilayer source/drain region is formed over the source/drain barrier material. A stack of nanostructures is formed by removing sacrificial layers of the multilayer stack, the multilayer source/drain region being electrically coupled to the stack of nanostructures.

20 Claims, 14 Drawing Sheets

(56) References Cited

U.S. PATENT DOCUMENTS

| | | |
|---|---|---|
| 9,412,817 B2 | 8/2016 | Yang et al. |
| 9,412,828 B2 | 8/2016 | Ching et al. |
| 9,472,618 B2 | 10/2016 | Oxland |
| 9,502,265 B1 | 11/2016 | Jiang et al. |
| 9,520,482 B1 | 12/2016 | Chang et al. |
| 9,536,738 B2 | 1/2017 | Huang et al. |
| 9,576,814 B2 | 2/2017 | Wu et al. |
| 9,608,116 B2 | 3/2017 | Ching et al. |
| 2019/0221640 A1* | 7/2019 | Reznicek .............. H01L 29/167 |
| 2019/0348403 A1* | 11/2019 | Mochizuki .......... H01L 21/0245 |
| 2020/0303521 A1* | 9/2020 | Son ................. H01L 21/823814 |

* cited by examiner

SEMICONDUCTOR DEVICES WITH A SOURCE/DRAIN BARRIER LAYER AND METHODS OF MANUFACTURE

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. However, as the minimum features sizes are reduced, additional problems arise that should be addressed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
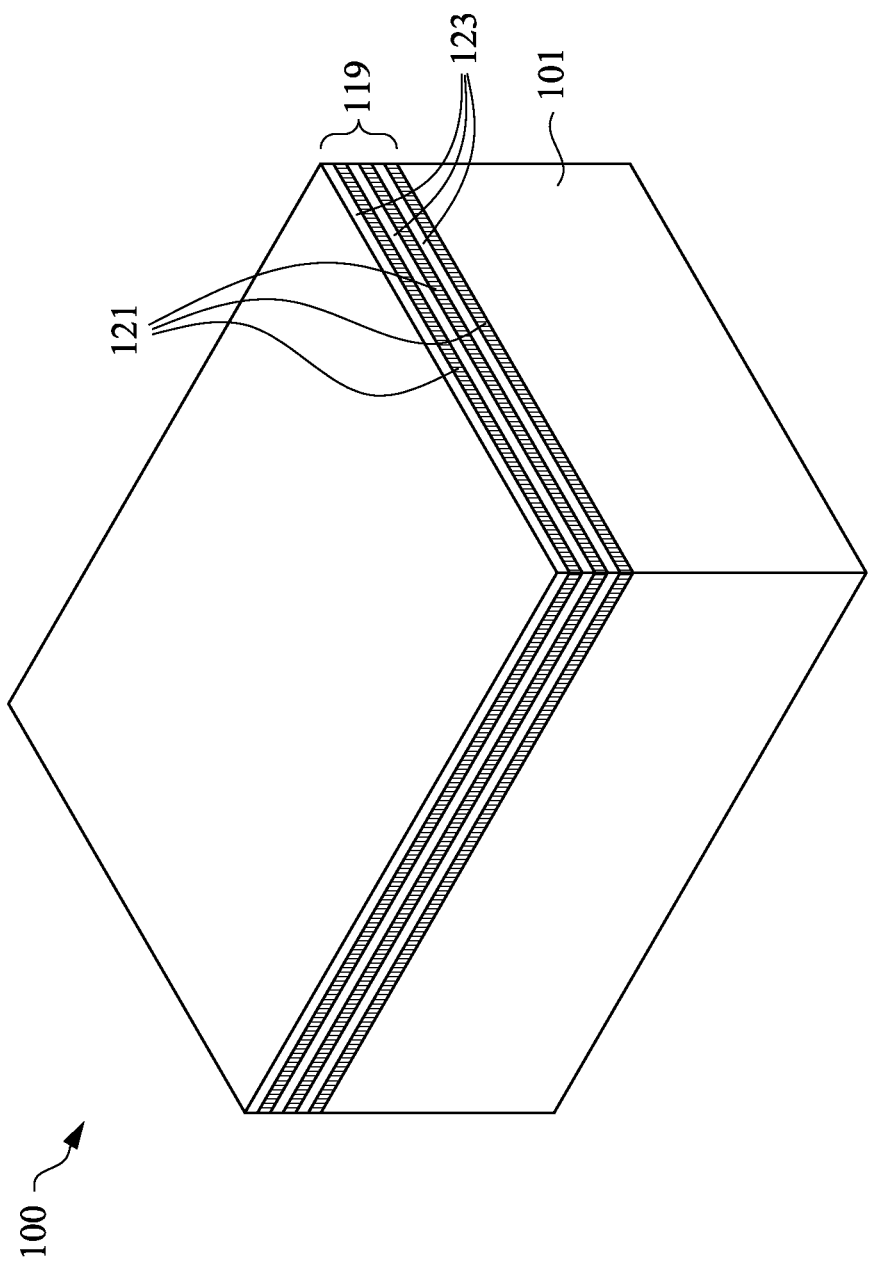
FIG. 1 illustrates, in a perspective view, a multilayer structure used to form an integrated circuit device, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments will now be described with respect to a particular embodiment which forms multiple active components including multiple nanostructure devices. However, the embodiments described are intended to be illustrative and are not intended to be limited to those embodiments that are expressly described herein. Rather, the ideas presented herein may be incorporated into a wide variety of embodiments.

With reference now to FIG. 1, there is shown in a perspective view a multi-layer structure 100 comprising a substrate 101 with a multilayer stack 119 of semiconductor materials formed over the substrate 101. The substrate 101 may be a silicon substrate, although other substrates, such as semiconductor-on-insulator (SOI), strained SOI, and silicon germanium on insulator, could be used. The substrate 101 may be a p-type semiconductor, although in other embodiments, it could be an n-type semiconductor. In some embodiments, the substrate 101 may comprise doped regions (e.g., p-type regions, n-type regions, anti-punch through doped regions, combinations, or the like).

In such embodiments, the multilayer stack 119 of semiconductor materials is formed through a series of depositions of alternating materials. In some embodiments, the multilayer stack 119 comprises first layers 121 of a first semiconductor material and second layers 123 of a second semiconductor material.

According to some embodiments, the first layers 121 may be formed using a first semiconductor material with a first lattice constant, such as SiGe, Ge, Si, GaAs, InSb, GaSb, InAlAs, InGaAs, GaSbP, GaAsSb, combinations of these, or the like. In some embodiments, a first layer 121 of the first semiconductor material (e.g., SiGe) is epitaxially grown on the substrate 101 using a deposition technique such as epitaxial growth, vapor-phase epitaxy (VPE), molecular beam epitaxy (MBE), although other deposition processes, such as chemical vapor deposition (CVD), low pressure CVD (LPCVD), atomic layer CVD (ALCVD), ultrahigh vacuum CVD (UHVCVD), reduced pressure CVD (RPCVD), combinations, or the like, may also be utilized. Once deposited, an optional planarization technique (e.g., chemical mechanical planarization (CMP)) may be performed to reduce a thickness of the first layer 121 to a desired thickness, according to some embodiments. In some embodiments, the first layer 121 is formed to first thicknesses of between about 30 Å and about 300 Å. However, any suitable thickness may be utilized while remaining within the scope of the embodiments.

Once the first layer 121 has been formed over the substrate 101, one of the second layers 123 may be formed over the first layer 121. According to some embodiments, the second layers 123 may be formed using a second semiconductor material such as Si, SiGe, Ge, GaAs, InSb, GaSb, InAlAs, InGaAs, GaSbP, GaAsSb, combinations of these, or the like with a second lattice constant that is different from the first lattice constant of the first layer 121. In a particular embodiment in which the first layer 121 is silicon germanium, the second layer 123 is a material such as silicon. However, any suitable combination of materials may be utilized for the first layers 121 and the second layers 123.

In some embodiments, the second layer 123 is epitaxially grown on the first layer 121 using a deposition technique similar to that used to form the first layer 121. Once grown, an optional planarization technique (e.g., chemical mechanical planarization (CMP)) may be performed to reduce a thickness of the second layer 123 to a desired thickness, according to some embodiments. However, the second layer 123 may use any of the deposition and/or optional planarization techniques suitable for forming the first layer 121, as set forth above or any other suitable techniques. According to some embodiments, the second layer 123 is formed to a similar thickness to that of the first layer 121. However, the second layer 123 may also be formed to a thickness that is different from the first layer 121. According to some embodiments, the second layer 123 may be formed to a second thickness of between about 10 Å and about 500 Å. However, any suitable thickness may be used.

Once the second layer 123 has been formed over the first layer 121, the deposition process is repeated to form the remaining material layers in the series of alternating materials of the first layers 121 and the second layers 123 until a desired topmost layer of the multilayer stack 119 has been formed. According to the present embodiment, the first layers 121 may be formed to a same or similar first thickness and the second layers 123 may be formed to the same or similar second thickness. However, the first layers 121 may have different thicknesses from one another and/or the second layers 123 may have different thicknesses from one another and any combination of thicknesses may be used for the first layers 121 and the second layers 123.

Although embodiments are disclosed herein comprising three of the first layers 121 and three of the second layers 123, the multilayer stack 119 may have any suitable number of layers. For example, the multilayer stack 119 may comprise a number of layers in a range between 2 to 20 layers. In some embodiments, the multilayer stack 119 may comprise equal numbers of the first layers 121 to the second layers 123; however, in other embodiments, the number of the first layers 121 may be different from the number of the second layers 123. Furthermore, the multilayer stack 119 may be formed over the substrate to any desired height.

As one of ordinary skill in the art will recognize, the process described above to form the multi-layer structure 100 is merely one potential process, and is not meant to be the only embodiment. Rather, any suitable process through which the multi-layer structure 100 may be formed may be utilized and any suitable process, including any number of deposition and optional planarization steps may be used.

Figure 2:
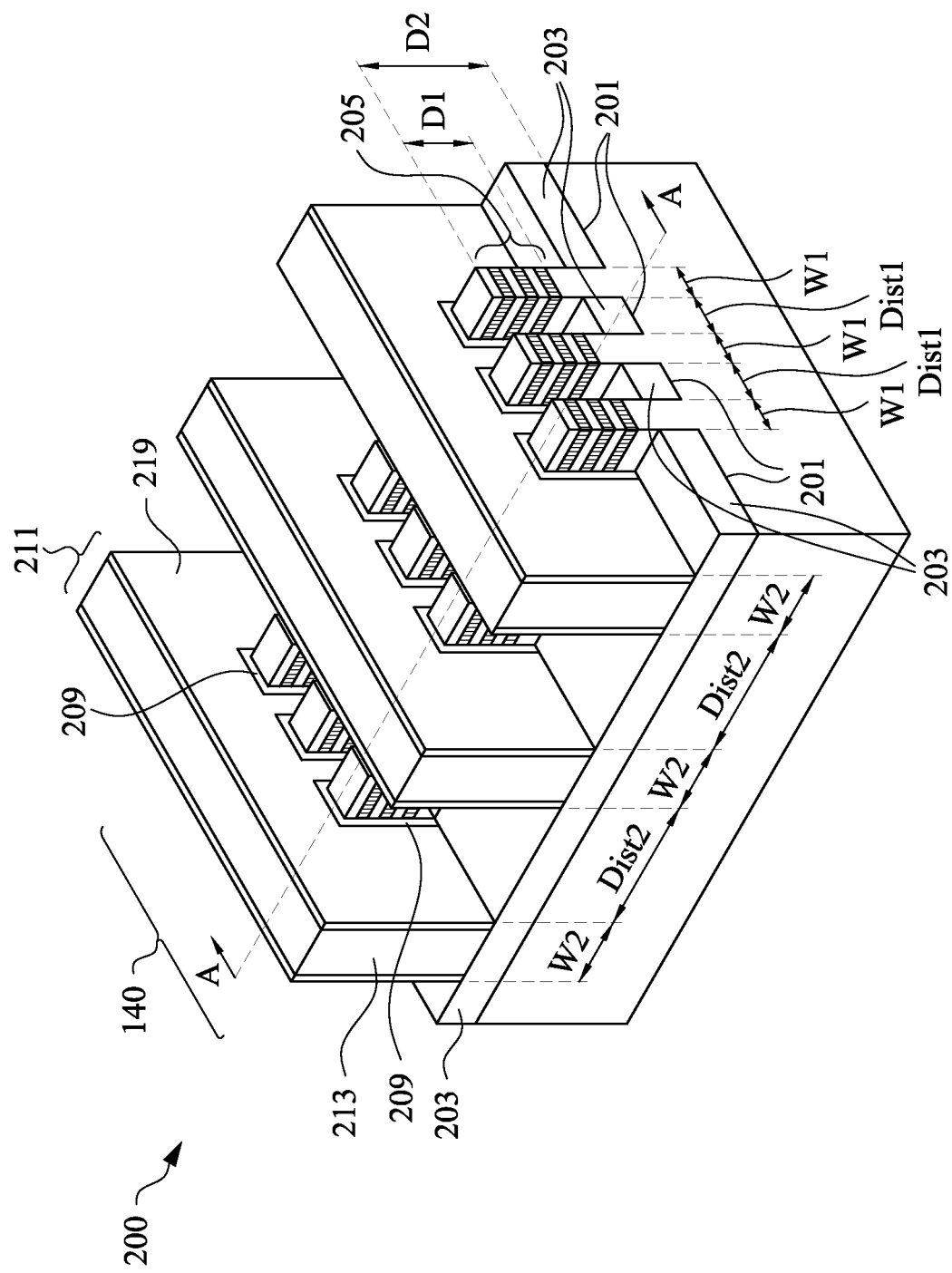
FIG. 2 illustrates a perspective view of a formation of dummy gate stacks and upper spacers over patterned multilayer stacks formed in the multilayer structure as an intermediate step in forming the integrated circuit device, in accordance with some embodiments.

FIG. 2 illustrates a perspective view of an intermediate structure 200 formed using the multi-layer structure 100, in accordance with some embodiments. In particular, FIG. 2 illustrates the formation of trenches 201 and patterned multilayer stacks 205 in the multi-layer structure 100. FIG. 2 further illustrates the formation of isolation regions 203 and the formation of dummy gate stacks 211 and upper spacers 219 over the isolation regions 203 and the patterned multilayer stacks 205, in accordance with some embodiments.

Once the multi-layer structure 100 has been formed, the trenches 201 are formed in the multi-layer structure 100 as an initial step in the eventual formation of isolation regions 203. The trenches 201 may be formed using a masking layer (not separately illustrated in FIG. 2) along with a suitable etching process. For example, the masking layer may be a hard mask comprising silicon nitride formed through a process such as chemical vapor deposition (CVD), although other materials, such as oxides, oxynitrides, silicon carbide, combinations of these, or the like, and other processes, such as plasma enhanced chemical vapor deposition (PECVD), low pressure chemical vapor deposition (LPCVD), or even silicon oxide formation followed by nitridation, may be utilized. Once formed, the masking layer may be patterned through a suitable photolithographic process to expose those portions of the multi-layer structure 100 that will be removed to form the trenches 201.

As one of skill in the art will recognize, however, the processes and materials described above to form the masking layer are not the only method that may be used to protect portions of the multi-layer structure 100 while exposing other portions of the multi-layer structure 100 for the formation of the trenches. Any suitable process, such as a patterned and developed photoresist, may be utilized to expose portions of the multi-layer structure 100 to be removed to form the trenches 201. All such methods are fully intended to be included in the scope of the present embodiments.

Once a masking layer has been formed and patterned, the trenches 201 are formed in the multi-layer structure 100. The exposed materials of the exposed portions of the multi-layer structure 100 may be removed through suitable processes such as one or more reactive ion etches (RIE) in order to form the trenches 201 in the multi-layer structure 100, although any suitable process may be used.

However, as one of ordinary skill in the art will recognize, the process described above to form the trenches 201 is merely one potential process, and is not meant to be the only embodiment. Rather, any suitable process through which the trenches 201 may be formed may be utilized and any suitable process, including any number of masking and removal steps may be used.

In addition to forming the trenches 201, the masking and etching process additionally forms a plurality of the patterned multilayer stacks 205 from those portions of the multilayer stack 119 and substrate 101 that remain unremoved. The patterned multilayer stacks 205 may also be referred to herein as "multilayer fins." These patterned multilayer stacks 205 may be used, as discussed below, to form active components, such as multi-channel devices (e.g., gate-all-around (GAA) metal-oxide-semiconductor field effect transistor (MOSFET), nanosheet field effect transistors (NSFETs), or the like). While FIG. 2 illustrates three of the multilayer fins, any number of the multilayer fins may be formed in the multi-layer structure 100.

According to some embodiments, the patterned multilayer stacks 205 may be formed to have a first width $W_1$ at the surface of the substrate 101 of between about 30 Å and about 5000 Å, according to some embodiments. Furthermore, the patterned multilayer stacks 205 may be formed spaced apart by a first distance $Dist_1$ of between about 5 nm and about 100 nm. However, any suitable widths and distances may be utilized. According to some embodiments, the first width $W_1$ of the patterned multilayer stacks 205 may be selected according to a desired channel width of a desired multi-channel device being formed. In some embodiments, the first distance $Dist_1$ between the multilayer fins may be close enough to share a common gate electrode or so-called "shared gate electrode."

Furthermore, while a particular embodiment has been described above to form the patterned multilayer stacks 205 in the multi-layer structure 100, these descriptions are intended to be illustrative and are not intended to be limiting. Rather, the patterned multilayer stacks 205 may be patterned by any suitable method. As another example, the patterned multilayer stacks 205 may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over the multi-layer structure 100 and patterned using a photolithography process. Spacers are formed alongside the patterned sacrificial layer using a self-aligned process. The sacrificial layer is then removed, and the remaining spacers may then be used to pattern the patterned multilayer stacks 205. Any suitable process may be utilized.

In an embodiment the isolation regions 203 are formed as shallow trench isolation (STI) regions by initially depositing a dielectric material in the trenches 201. According to some embodiments, the dielectric material used to form the isolation regions 203 may be a material such as an oxide material (e.g., a flowable oxide), high-density plasma (HDP) oxide, or the like. The dielectric material may be formed, after an optional cleaning and lining of the trenches, using either a chemical vapor deposition (CVD) method (e.g., the HARP process), a high density plasma CVD method, or other suitable method of formation to fill or overfill the regions around the patterned multilayer stacks 205. In some embodiments, a post placement anneal process (e.g., oxide densification) is performed to densify the material of the isolation regions 203 and to reduce its wet etch rate. Furthermore one or more planarization processes such as chemical mechanical polishing (CMP), etches, combinations, or the like may be performed to remove any excess material of the isolation regions 203.

Once the dielectric material has been deposited to fill or overfill the regions around the patterned multilayer stack 205, the dielectric material may then be recessed to form the isolation regions 203. The dielectric material may be recessed using a wet etch by dipping the structure into an etchant selective to the material of the dielectric material, although other methods, such as a reactive ion etch, a dry etch, chemical oxide removal, or dry chemical clean may be used.

FIG. 2 further illustrates the formation of a dummy gate dielectric 209 over the patterned multilayer stacks 205 exposed above the isolation regions 203. The dummy gate dielectric 209 may be formed by thermal oxidation, chemical vapor deposition, sputtering, or any other methods known and used in the art for forming a gate dielectric. Depending on the technique of gate dielectric formation, the dummy gate dielectric 209 thickness on the top may be different from the dummy dielectric thickness on the sidewall. In some embodiments, the dummy gate dielectric 209 may be formed by depositing a material such as silicon and then oxidizing or nitridizing the silicon layer in order to form a dielectric such as the silicon dioxide or silicon oxynitride. In such embodiments, the dummy gate dielectric 209 may be formed to a thickness ranging from between about 3 Å and about 100 Å. In other embodiments, the dummy gate dielectric 209 may also be formed from a high permittivity (high-k) material such as lanthanum oxide ($La_2O_3$), aluminum oxide ($Al_2O_3$), hafnium oxide ($HfO_2$), hafnium oxynitride (HfON), or zirconium oxide ($ZrO_2$), or combinations thereof, with an equivalent oxide thickness of between about 0.5 Å and about 100 Å. Additionally, any combination of silicon dioxide, silicon oxynitride, and/or high-k materials may also be used for the dummy gate dielectric 209.

FIG. 2 further illustrates the formation of a dummy gate electrode 213 over the dummy gate dielectric 209, with a first hard mask (not separately illustrated) over the dummy gate electrode 213, and a second hard mask (also not separately illustrated) over the first hard mask, in accordance with some embodiments. The dummy gate dielectric 209, the dummy gate electrode 213, the first hard mask, and the second hard mask are collectively referred to herein as the dummy gate stacks 211.

In some embodiments, the dummy gate electrode 213 comprises a conductive material and may be selected from a group comprising of polysilicon, W, Al, Cu, AlCu, Ti, TiAlN, TaC, TaCN, TaSiN, Mn, Zr, TiN, Ta, TaN, Co, Ni, combinations of these, or the like. The dummy gate electrode 213 may be deposited by chemical vapor deposition (CVD), sputter deposition, or other techniques known and used in the art for depositing conductive materials. The thickness of the dummy gate electrode 213 may be in the range of about 5 Å to about 500 Å. The top surface of the dummy gate electrode 213 may have a non-planar top surface, and may be planarized prior to patterning of the dummy gate electrode 213 or gate etch. Ions may or may not be introduced into the dummy gate electrode 213 at this point. Ions may be introduced, for example, by ion implantation techniques.

Once the dummy gate electrode 213 has been formed, the dummy gate dielectric 209 and the dummy gate electrode 213 may be patterned. In an embodiment the patterning may be performed by initially forming the first hard mask over the dummy gate electrode 213 and forming the second hard mask over the first hard mask.

According to some embodiments, the first hard mask comprises a dielectric material such as silicon oxide (SiO), silicon nitride (SiN), oxide (OX), titanium nitride (TiN), silicon oxynitride (SiON), combinations of these, or the like. The first hard mask may be formed using a process such as chemical vapor deposition, plasma enhanced chemical vapor deposition, atomic layer deposition, or the like. However, any other suitable material and method of formation may be utilized. The first hard mask may be formed to a thickness of between about 20 Å and about 3000 Å.

The second hard mask comprises a separate dielectric material from the material of the first hard mask. The second hard mask may comprise any of the materials and use any of the processes suitable for forming the first hard mask and may be formed to a same or similar thickness as the first hard mask. In embodiments where the first hard mask comprises an oxide (OX), the second hard mask may be e.g., silicon nitride (SiN). However, any suitable dielectric materials, processes and thicknesses may be used to form the second hard mask.

Once the first hard mask and the second hard mask have been formed, the first hard mask and the second hard mask may be patterned. In an embodiment the masks may be patterned by initially placing a photoresist (not individually illustrated) over the second hard mask and exposing the photoresist to a patterned energy source (e.g., light) in order to initiate a chemical reaction that modifies the physical properties of the exposed portions of the first photoresist. The first photoresist may then be developed by applying a first developer (also not individually illustrated) in order to utilize the modified physical properties between the exposed region and the unexposed region to selectively remove either the exposed region or the unexposed region.

Once the photoresist has been patterned, the photoresist may be used as a mask in order to pattern the underlying hard masks. In an embodiment the first hard mask and the second hard mask may be patterned using, e.g., one or more reactive ion etching (RIE) processes with the photoresist as a mask. The patterning process may be continued until the dummy gate electrode 213 is exposed beneath the first hard mask.

Once the first hard mask and the second hard mask have been patterned, the photoresist may be removed utilizing, e.g., an ashing process, whereby a temperature of the photoresist is raised until the photoresist experiences a thermal decomposition and may be easily removed using one or more cleaning process. However, any other suitable removal process may be utilized.

Once the first hard mask and the second hard mask have been patterned, the dummy gate electrode 213 and the dummy gate dielectric 209 may be patterned in order to form a series of the dummy gate stacks 211. In an embodiment the dummy gate electrode 213 and the dummy gate dielectric 209 are patterned using an anisotropic etching process, such as a reactive ion etch, although any suitable process may be utilized. As such, the dummy gate stacks 211 are disposed over the patterned multilayer stacks 205 in desired locations of multilayer channel regions to be formed. In regions between the dummy gate stacks 211, the top surfaces and sidewalls of the patterned multilayer stacks 205 and top surfaces of the isolation regions 203 are exposed. According to some embodiments, the dummy gate stacks 211 may be formed to a second width W2 of between about 2 nm and about 200 nm and may be spaced apart from one another by a second distance Dist2 of between about 5 nm and about 100 nm. However, any suitable width and distance may be utilized. According to some embodiments, the second width W2 of the dummy gate stacks 211 may be selected according to a desired channel length of the desired multi-channel device being formed. Furthermore, although FIG. 2 illustrates three of the dummy gate stacks 211, any suitable number of dummy gate stacks 211 may be formed. For example, in some embodiments, fewer than three of the dummy gate stacks 211 such as two or one of the dummy gate stacks 211 may be formed. As a further example, in some embodiments, more than three of the dummy gate stacks 211 such as four or more of the dummy gate stacks 211 stacks may be formed.

FIG. 2 further illustrates the formation of upper spacers 219. According to an embodiment, a spacer material is formed by blanket deposition on the dummy gate stacks 211 and the exposed portions of the patterned multilayer stacks 205 and the isolation regions 203. As such, the spacer material is deposited over the top surfaces and sidewalls of the dummy gate stacks 211 and over the top surfaces and sidewalls of the patterned multilayer stacks 205 and top surfaces of the isolation regions 203 not covered by the dummy gate stacks 211. According to some embodiments, the spacer material comprises a dielectric material and is formed using methods such as chemical vapor deposition (CVD), plasma enhanced CVD, sputter, thermal oxidation, and any other suitable methods. According to some embodiments, the spacer material comprises materials such as silicon oxide ($SiO2$), silicon oxynitride (SiON), silicon nitride ($Si_3N_4$), silicon oxycarbide (SiOC), silicon oxycarbonitride (SiOCN), although any suitable material, such as low-k materials with a k-value less than about 4.0, combination thereof, or the like may be utilized.

Once formed, the spacer material may be etched in order to shape the upper spacers 219 on the dummy gate stacks 211 and to re-expose the tops of the dummy gate stacks 211, the tops and sidewalls of the patterned multilayer stacks 205, and the tops of the isolation regions 203. According to some embodiments, the spacer material may be etched using an anisotropic etching process (e.g., a dry etching process) such as a reactive ion etching (RIE) process, an isotropic etching process (e.g., a wet etching process), combination thereof, or the like. In some embodiments, the spacer material formed over the patterned multilayer stacks 205 in source/drain regions may be recessed during the etching process and/or during a subsequent etching process such that portions along the sidewalls of the patterned multilayer stacks 205 in those source/drain regions are exposed.

However, while embodiments are described using a single spacer material, this is intended to be illustrative and is not intended to be limiting. Rather, any number of spacer materials and any combinations of deposition and removal processes may be used, and all such processes are fully intended to be included within the scope of the embodiments. For example, a tri-layer spacer may be formed as the upper spacers 219. According to an embodiment, the tri-layer spacer material may comprise a first thin-film dielectric layer (e.g., SiN, oxynitride, SiC, SiON, SiOCN, SiOC, oxide, etc.), a second thin-film dielectric layer (e.g., SiN, oxynitride, SiC, SiON, SiOCN, SiOC, oxide, etc.), and a third thin-film dielectric layer (e.g., SiN).

FIG. 2 further illustrates a cutline A-A overlying the intermediate structure 200. Cutline A-A is taken along the length of one of the patterned multilayer stacks 205 and is used in reference with the following figures and descriptions.

Figure 3A:
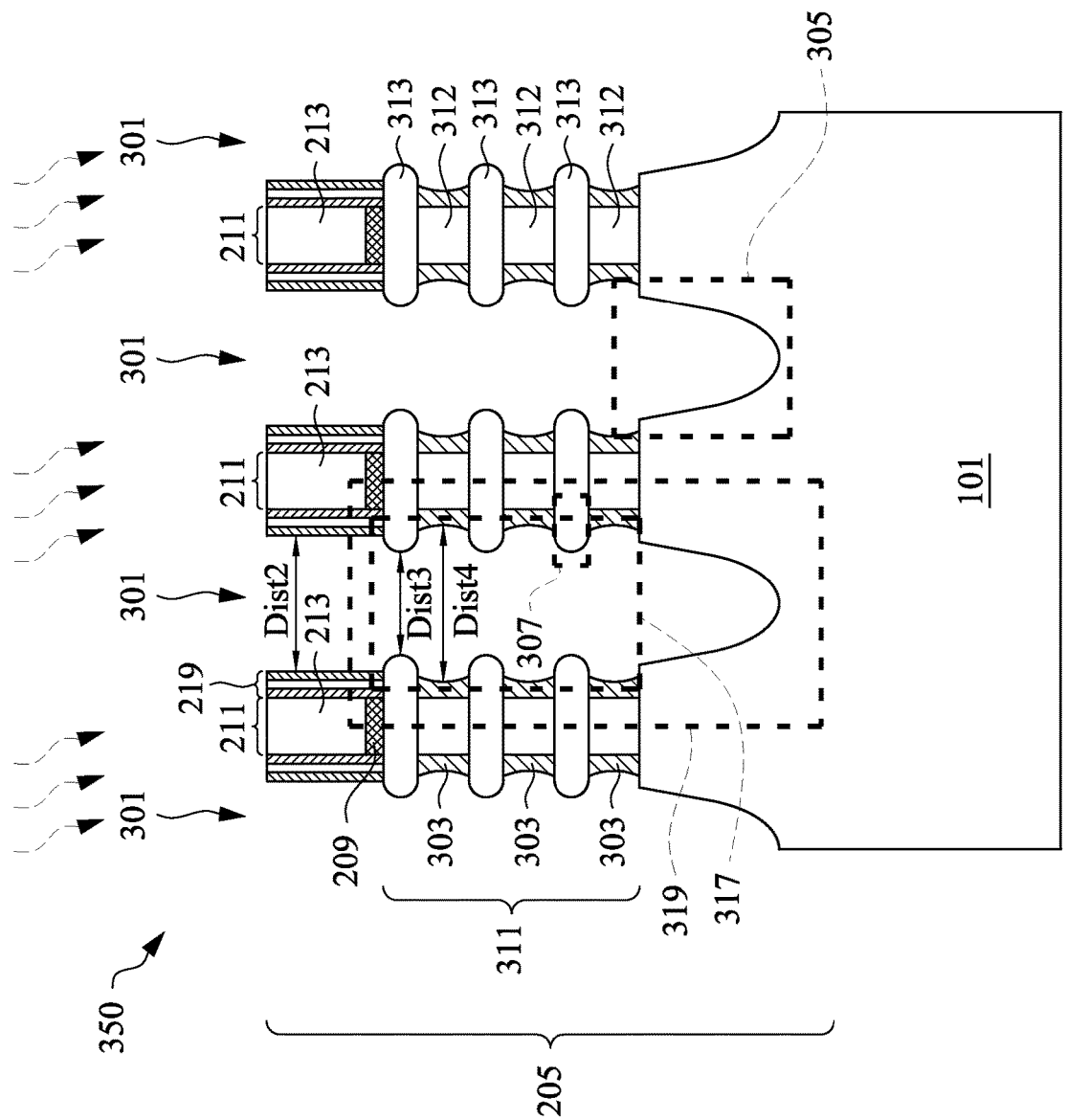
FIGS. 3A and 3B illustrate cross-sectional views of a first recess etching process used in an intermediate step of forming the semiconductor device, in accordance with some embodiments.
Figure 3B:
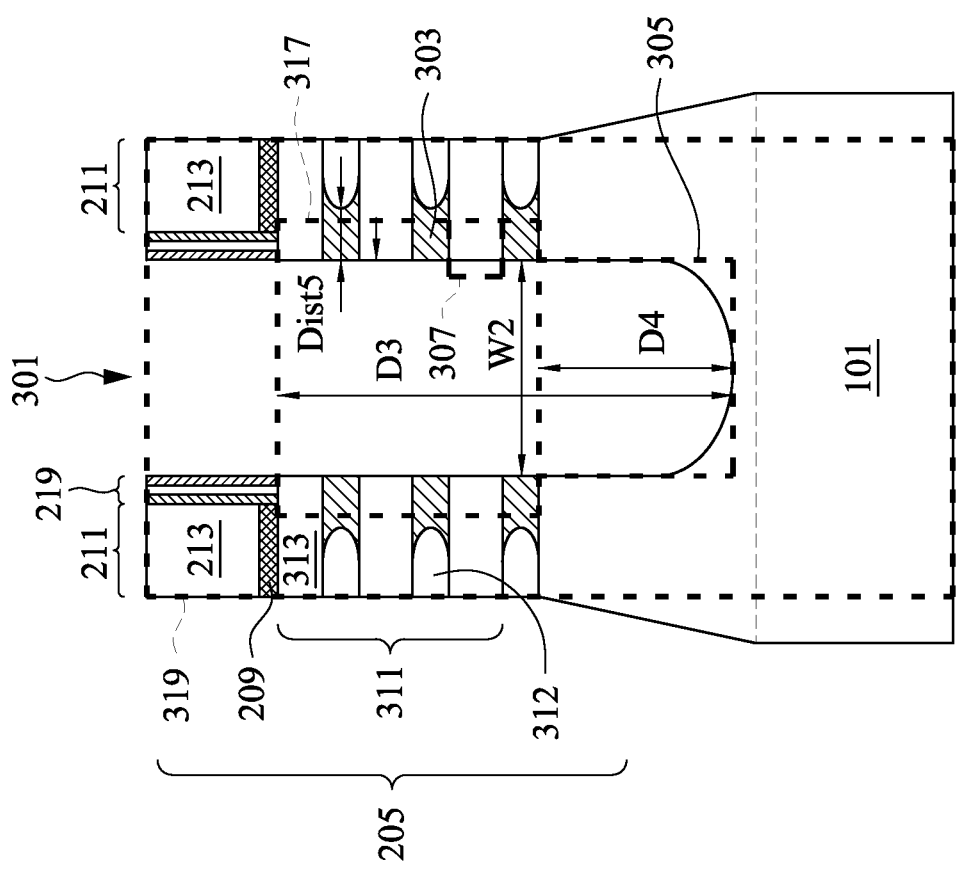

FIGS. 3A and 3B illustrate cross-sectional views along cutline A-A of a first recess etching process 350 used in an intermediate step of forming the semiconductor device, in accordance with some embodiments. In particular, FIG. 3A illustrates the formation of first openings 301 as an initial step of forming multilayer source/drain regions of the semiconductor device, in some embodiments. FIG. 3B illustrates a magnified view of a portion 319 of a first opening 301 illustrated in FIG. 3A.

According to some embodiments, the first openings 301 may be formed by using the upper spacers 219 as masks and performing the first recess etching process 350 to selectively remove the materials of the patterned multilayer stacks 205 and/or the substrate 101 in desired locations of multilayer source/drain regions. As such the first openings 301 divide the patterned multilayer stacks 205 into a series of nanostructure stacks 311 within the multilayer channel regions underlying the dummy gate stacks 211. The nanostructure stacks 311 comprise the first layers 121 (relabeled sacrificial layers 312 in FIGS. 3A and 3B) and the second layers 123 (relabeled nanostructures 313 in FIGS. 3A and 3B).

According to some embodiments, the first recess etching process 350 may be performed using a combination and/or selective tuning of multiple anisotropic etches and/or isotropic etches to remove the materials of the second layers 123 and the materials of the first layers 121. The first recess etching process 350 may be performed using anisotropic wet chemical etches, anisotropic dry etches, isotropic dry etches, combinations, or the like. The anisotropic wet chemical etches use solutions such as potassium hydroxide (KOH), tetra-methyl ammonium (TMAH) and ethylene di-amine pyrocatechol (EDP). The anisotropic dry etches use plasmas sources such as $CF_4$, $CH_3F$, HBr, $O_2$, He, Ar, combinations, or the like and are performed with a bias power. The isotropic dry etches use plasma sources such as $NF_3$, $CL_2$, $H_2$, Ar, He, combinations, or the like.

The first recess etching process 350 may be performed using a combination of etches and/or through selectively tuning such that the sacrificial layers 312 may be initially formed with a profile that is substantially vertical and coterminous with the sidewalls of the first openings 301 (as shown in FIG. 3B), in accordance with some embodiments. However, the sacrificial layers 312 and the nanostructures 313 may be formed shaped to any suitable profiles at the sidewalls of the first openings 301. According to some embodiments, nanostructures 313 may be formed with an optional channel profile 307 (as shown in FIG. 3A). The optional channel profile 307 may have any suitable shape (e.g., a convex round shape) such that the nanostructures 313 at the sidewalls of the first openings 301 extend in a radial direction towards a centerline of the first openings 301.

The first recess etching process 350 may be performed using a combination of etches and/or through selectively tuning such the first openings 301 are shaped to desired recess profiles at the bottoms of the first openings 301. In some embodiments, the first openings 301 are formed to have a first recess profile 305 that is a deep concave rounded shape.

In some embodiments, the first openings 301 may extend from the tops of the series of nanostructure stacks 311 and into the substrate 101 to a third depth D3 of between about 50 nm and about 80 nm. According to some embodiments, the first recess profile 305 is formed with a concave rounded shape having the second width W2 at the top of the substrate 101 and extends into the substrate 101 to a fourth depth D4. The deep concave rounded shape of the first recess profile 305 may be formed, according to some embodiments, using an anisotropic dry etch with a plasma source ($CF_4$) and a power bias. As such, the first recess profile 305 is formed to have the concave rounded shape with the second width W2 at the top of substrate 101 of between about 3 nm and about 100 nm and the fourth depth D4 of between about 20 nm and about 25 nm. However, any suitable shapes, widths, and depths may be utilized for the first recess profile 305.

FIGS. 3A and 3B further illustrate the formation of inner spacers 303 adjacent to the sacrificial layers 312, in accordance with some embodiments. According to some embodiments the sacrificial layers 312 may be recessed during the formation of the first openings 301 through the first layers 121. In other embodiments, the sacrificial layers 312 are initially formed coterminous with the sidewalls of the first openings 301 and are subsequently recessed to a desired distance. In some embodiments, the recesses are formed in the sacrificial layers 312 using a wet etch with an etchant that is more selective to the material of the sacrificial layers 312 (e.g., silicon germanium (SiGe)) than the material of the nanostructures 313 (e.g., silicon (Si)) or the substrate 101 (e.g., silicon (Si)). For example, in an embodiment in which the sacrificial layers 312 are silicon germanium and the nanostructures 313 are silicon, the wet etch may use an etchant such as hydrochloric acid (HCl).

In an embodiment in which the sacrificial layers 312 are recessed after forming the first opening 301, the wet etching process may be performed using a dip process, a spray process, a spin-on process, or the like and may be performed using any suitable process temperatures (e.g., between about 400° C. and about 600° C.) and any suitable process times (e.g., between about 100 seconds and about 1000 seconds). However, any suitable process conditions and parameters may be utilized. The etching process may be continued such that recesses are formed in each of the sacrificial layers 312 to a fifth distance Dist5 of between about 5 nm and about 10 nm. However, any suitable distance may be used. The distal ends of the sacrificial layers 312 may be formed to have any suitable profile (e.g., rounded, vertical, facet-limited, convex, concave, or the like). In the illustrated embodiment of FIG. 3A, the distal ends of the sacrificial layers 312 are formed to have vertical profiles. In the illustrated embodiment of FIG. 3B, the distal ends of the sacrificial layers 312 are formed to have rounded profiles.

However, a wet etching process is not the only process that may be utilized to recess the sacrificial layers 312. For example, in another embodiment the recessing of the sacrificial layers 312 may be performed with an isotropic dry etching process or a combination of a dry etching process and a wet etching process. Furthermore, an optional cleaning process may be performed to remove any oxide buildup at the exposed surfaces of the sacrificial layers 312, at the exposed surfaces of the first recess profile 305 and at any other exposes surfaces along sidewalls of the first openings 301. Any suitable process of recessing the sacrificial layers 312 may be utilized, and all such processes are fully intended to be included within the scope of the embodiments.

Once the recesses are formed in each of the sacrificial layers 312, a spacer material is formed in the first openings 301 which fills and/or overfills each of the recesses. In some embodiments, the spacer material can be different from the material of the upper spacers 219 and can be a dielectric material comprising silicon such as silicon nitride (SiN), silicon oxide ($SiO_2$), silicon oxynitride (SiON), silicon oxycarbonitride (SiOCN), silicon carbonitride (SiCN), silicon oxycarbide (SiOC), although any suitable material such as low-k materials with a k-value less than about 4.0, or combination thereof may also be utilized. The spacer material may be deposited using a deposition process such as chemical vapor deposition, physical vapor deposition, or atomic layer deposition to a thickness of between about 5 nm and about 10 nm. However, any suitable thickness or deposition process may be utilized.

By depositing the spacer material over the first openings 301, the spacer material will line the sidewalls of the first openings 301 and will also fill in the recesses adjacent to the sacrificial layers 312. Once the recesses have been filled with the spacer material, a removal process is then performed to remove any excess spacer material from the first openings 301, while leaving behind the inner spacers 303. In an embodiment, the removal of the excess spacer material may be performed using an etching process such as, e.g., an anisotropic, dry etching process such as a reactive ion etching process. However, any suitable etching process, which removes the excess spacer material from the first openings 301 while leaving behind the inner spacers 303, may be utilized.

By filling the recesses with the spacer material and removing the excess spacer material from the first openings 301, the inner spacers 303 will take on the shape of the recesses. Additionally, while an embodiment forming the inner spacers 303 to faceted shapes is illustrated in FIG. 3A, this is intended to be illustrative and is not intended to be limited. Rather, the inner spacers 303 may be formed coterminous with the sidewalls of the first openings 301 as illustrated in FIG. 3B. Furthermore, any suitable shape may be provided for the inner spacers 303, such as a concave shape or a convex shape, or even the inner spacers 303 being recessed may be utilized. All such shapes are fully intended to be included within the scope of the embodiments. According to some embodiments, the inner spacers 303 may be formed to a width of between about 2 nm and about 10 nm and a height of between about 5 nm and about 20 nm. However, any suitable widths, heights, and distances may be utilized.

According to some embodiments, the first recess etching process 350 is controlled and/or selectively tuned such that the first openings 301 are formed with the recess profile in the substrate 101, the nanostructures 313 having a channel profile, and the inner spacers 303 having been recessed as illustrated in FIG. 3A. As such, the first openings 301 are formed with a sidewall profile 317 having a third distance Dist3 between nanostructures 313 and a fourth distance Dist4 between inner spacers 303. According to some embodiments, the third distance Dist3 is a distance between about 3 nm and about 100 nm. In some embodiments, the fourth distance Dist4 is a distance between about 3 nm and about 100 nm. However, any suitable distances may be used for the third distance Dist3 and the fourth distance Dist4. According to some other embodiments, the first recess etching process 350 is controlled such that the sidewalls of the first openings 301 are substantially vertical and the first openings 301 are formed with a recess profile in the substrate 101 as illustrated in FIG. 3B.

Figure 5:
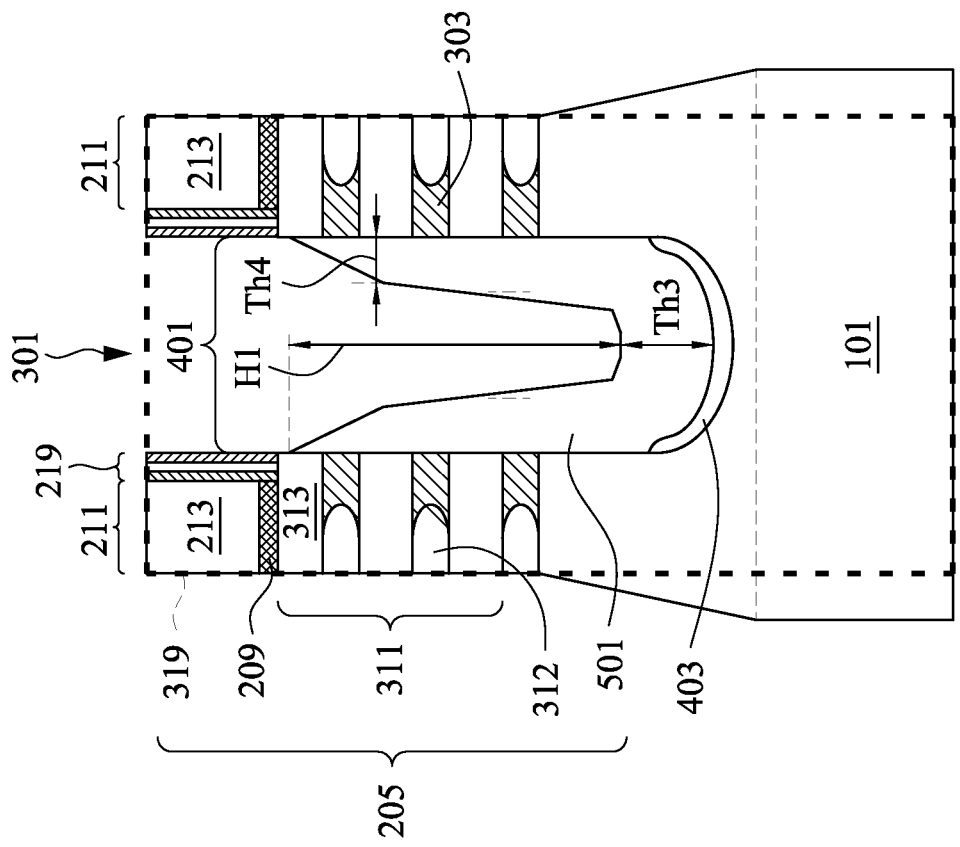
FIGS. 4-8 illustrates cross-sectional views of intermediate steps of forming multilayer source/drain regions, a contact etch stop layer, and a first interlayer dielectric layer within openings formed in the first recess etching process, in accordance with some embodiments.
Figure 4:
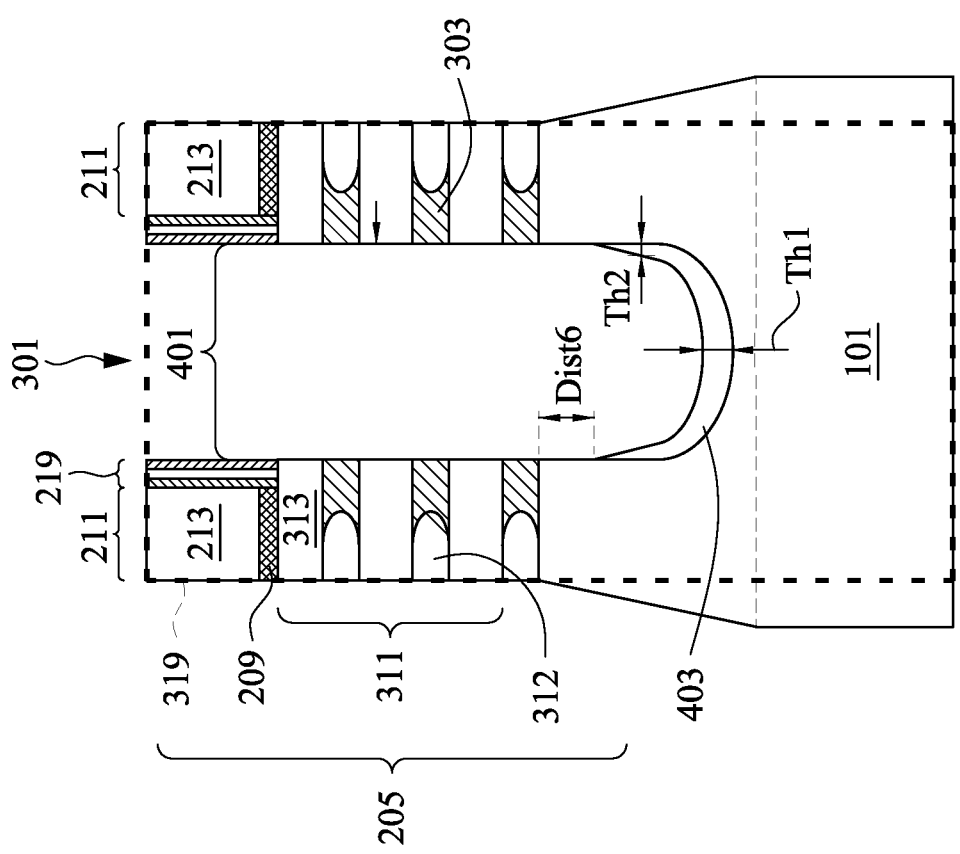
Figure 6:
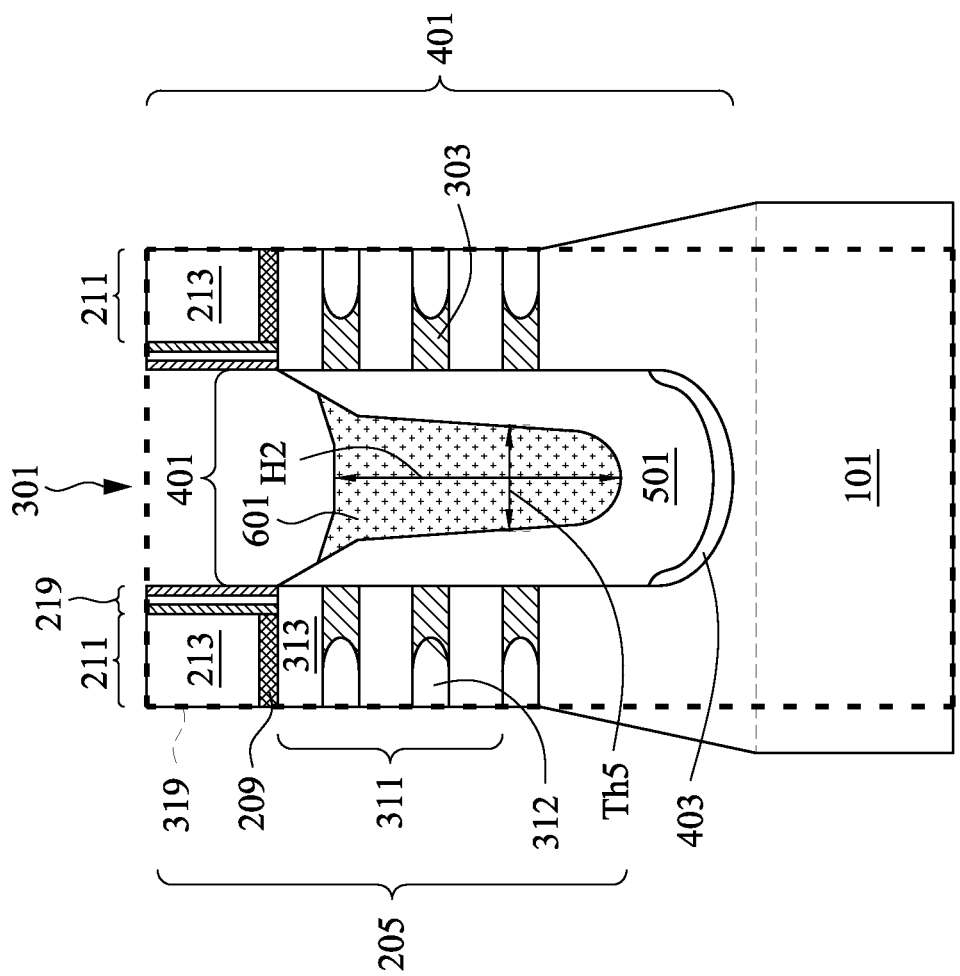

FIGS. 4-6 illustrates cross-sectional views of intermediate steps of forming the multilayer source/drain regions 401, in accordance with some embodiments. In particular, FIG. 4 illustrates a formation of a first source/drain barrier layer 403 in the first openings 301, in accordance with some embodiments. FIG. 5 illustrates a formation of a first epitaxial growth layer 501 over the first source/drain barrier layer 403, according to some embodiments. FIG. 6 illustrates a formation of a second epitaxial growth layer 601 over the first epitaxial growth layer 501 of the semiconductor device, according to some embodiments.

FIG. 4 illustrates the formation of the first source/drain barrier layer 403 at the bottom of the first openings 301 as an intermediate step in forming the multilayer source/drain regions 401, according to some embodiments. The first source/drain barrier layer 403 may be epitaxially grown in a bottom-up deposition process forming at the bottom of the first opening 301 and along sidewalls of the first openings 301. According to some embodiments, the first source/drain barrier layer 403 may be formed as an undoped semiconductor layer, such as an undoped silicon layer using precursors for silicon (Si) such as dichlorosilane ($SiH_2Cl_2$) which may also be referred to herein as DCS, silane ($SiH_4$), disilane ($Si_2H_6$), or the like. In some embodiments the silicon precursors may be flowed into a reaction chamber at a flow rate of between about 50 sccm and about 150 sccm. However, any suitable flow rates may be utilized.

Additionally, in order to help shape the formation of the first source/drain barrier layer 403, an etching precursor may also be added in order to etch some portions of the source/drain barrier layer 403 as it is being grown (e.g., selectively etched along a crystalline orientation). In some embodiments the etching precursor may be an etchant such as hydrochloric acid (HCl) or the like and may be flowed at a flow rate of between about 50 sccm and about 150 sccm. However, any suitable etching precursor may be utilized.

According to some embodiments, the deposition process used to form the first source/drain barrier layer 403 may be performed using a process temperature between about 600° C. and about 800° C. In addition, the deposition process used to form the first source/drain barrier layer 403 may be performed using a process pressure between about 10 torr and about 30 torr, in accordance with some embodiments. Other deposition processes or process parameters may also be used.

According to some embodiments, the deposition process is continued until the first source/drain barrier layer 403 is formed to a first thickness Th1 of between about 10 nm and about 20 nm at the bottom of the first opening 301. According to some embodiments, the first source/drain barrier layer 403 may be formed with a first thickness ratio of the second thickness Th2 to the first thickness Th1 of between about 1:1 and about 1:10. However, any suitable thickness and ratio may be used. In some embodiments, the first source/drain barrier layer 403 is formed along the sidewalls of the first opening 301 to a point located a sixth distance Dist6 from a bottommost one of the sacrificial layers 312. According to some embodiments, the sixth distance Dist6 is a distance that is at least 2 nm. However, any suitable distance may be used. In the illustrated embodiment, the first source/drain barrier layer 403 is formed as a meniscus shaped structure at the bottom of the first opening 301. However, the first source/drain barrier layer 403 may be formed to any suitable shaped structure.

FIG. 5 illustrates the formation of the first epitaxial growth layer 501 over the first source/drain barrier layer 403 as an intermediate step in forming the multilayer source/drain regions 401, according to some embodiments. Once the first source/drain barrier layer 403 has been formed, the first epitaxial growth layer 501 is formed using an epitaxial growth process at the bottom of the first opening 301 and along surfaces of the nanostructures 313 and the inner spacers 303 that are exposed at the sidewalls of the first openings 301. According to some embodiments, the first epitaxial growth layer 501 is formed using a deposition technique such as epitaxial growth, vapor-phase epitaxy (VPE), molecular beam epitaxy (MBE), combinations, or the like. However, any suitable deposition processes may be utilized. In addition, the first epitaxial growth layer 501 is formed using any of the precursors for silicon (Si) suitable for forming the first source/drain barrier layer 403 (e.g., DCS) and using precursors for germanium (Ge) such as germane ($GeH_4$), other germanium precursors, or the like. However, other materials such as those materials suitable for forming the second layers 123 such as hydrochloric acid (HCl), phosphane ($PH_3$), arsane ($AsH_3$), diborane ($B_2H_6$), the like, or combinations thereof may also be used. The first epitaxial growth layer 501 may be doped using a dopant (e.g., boron (B)). However, any suitable dopants may be used.

According to some embodiments, the first epitaxial growth layer 501 is formed as a first concentration percentage by volume of germanium (Ge %1) in a silicon germanium (SiGe) material layer. According to some embodiments, the first percentage concentration of germanium (Ge %1) is within a first range of concentrations by volume where 10%≤Ge %1<30%. According to some embodiments, the first concentration percentage by volume of germanium (Ge %1) represents a constant concentration level of germanium (Ge) throughout the structures of the first epitaxial growth layer 501. In other embodiments, the first percentage concentration of germanium (Ge %1) represents a gradient of concentration levels of germanium (Ge) throughout the structure of the first epitaxial growth layer 501. For example, the structure of the first epitaxial growth layer 501 may have a concentration level gradient for which the concentration level of germanium increases as a distance from the substrate 101 increases. As such, the gradient of concentration levels of germanium (Ge) may go from 10% at the bottom of the first epitaxial growth layer 501 which interfaces the first source/drain barrier layer 403 to about 30% at the top of the first epitaxial growth layer 501. In such embodiments, the concentration level gradient may be formed during growth by tuning one or more of flow rates of precursors used to form the first epitaxial growth layer 501 and increase the percentage concentration of germanium during deposition.

According to some embodiments, the first epitaxial growth layer 501 is lightly doped (e.g., a concentration by volume of between about $2\times10^{20}$ cm$^{-3}$ and about $3\times10^{20}$ cm$^{-3}$) with an n-type dopant (e.g., boron (B)). However, any suitable n-type dopant may be utilized. According to some embodiments, the dopants of the first epitaxial growth layer 501 may be placed during the growth of the first epitaxial growth layer 501. For example, the n-type dopant may be placed in situ as the first epitaxial growth layer 501 is being formed. However, any suitable process for placing the dopants within the first epitaxial growth layer 501 may be utilized, and all such processes are fully intended to be included within the scope of the embodiments.

Furthermore, the deposition process may be controlled such that the first epitaxial growth layer 501 is epitaxially grown from the first source/drain barrier layer 403 at the bottoms of the first openings 301 and along sidewalls of the first openings 301 in a bottom-up deposition process. For example, the first epitaxial growth layer 501 may be formed and shaped along sidewalls of the first openings 301 by tuning the flow rates of the precursors and process regions used in the deposition process. In embodiments in which the nanostructures 313 are formed with the first channel profile 307 as described above, the first epitaxial growth layer 501 conforms to the shapes of the nanostructures 313 and inner spacers 303 which may provide certain stresses to the nanostructures 313.

According to some embodiments, the deposition process used to form the first epitaxial growth layer 501 may be performed using a process temperature between about 500° C. and about 800° C. In addition, the deposition process used to form the first epitaxial growth layer 501 may be performed using a process pressure between about 5 torr and about 300 torr, in accordance with some embodiments. The gases and/or precursors may be flowed into a processing chamber at a rate between about 10 sccm and about 2000 sccm and for a period of time of between about 50 seconds and about 3000 seconds. Other deposition processes or process parameters may also be used. According to some embodiments, the deposition process is continued until the first epitaxial growth layer 501 grows to a third thickness Th3 of between about 5 nm and about 20 nm at the bottom of the first opening 301 and a fourth thickness Th4 of between about 4 nm and about 6 nm along the sidewalls of the first opening 301. According to some embodiments, the first epitaxial growth layer 501 may be formed with a second thickness ratio of the fourth thickness Th4 to the third thickness Th3 of between about 1:1 and about 1:10. According to some embodiments, the first epitaxial growth layer 501 may be grown to a first height H1 above the first source/drain barrier layer 403. In some embodiments, the first epitaxial growth layer 501 may be formed above the uppermost nanostructures 313 and along sidewalls of the upper spacers 219. According to some embodiments, the first height H1 is a height between about 60 nm and about 80 nm. However, any suitable height may be used.

FIG. 6 illustrates the formation of the second epitaxial growth layer 601 in the first openings 301, according to some embodiments. Once the first epitaxial growth layer 501 has been formed, the second epitaxial growth layer 601 may be formed over the first epitaxial growth layer 501. According to some embodiments, the second epitaxial growth layer 601 is formed using any of the deposition processes and precursors for silicon (Si) and germanium (Ge) suitable for forming the first epitaxial growth layer 501 as set forth above. In some embodiments, the precursors used for the second epitaxial growth layer 601 are the same precursors used for the first epitaxial growth layer 501. According to some embodiments, the second epitaxial growth layers 601 are formed using precursors such as DCS and germane (GeH$_4$). However, other materials such as those materials suitable for forming the first epitaxial growth layer 501 such as hydrochloric acid (HCl), phosphane (PH$_3$), arsane (AsH$_3$), diborane (B$_2$H$_6$), the like, or combinations thereof may also be used. In some embodiments, the second epitaxial growth layer 601 is doped with an n-type dopant (e.g., boron (B)). However, other dopants may also be utilized.

According to some embodiments, the second epitaxial growth layer 601 is formed as a second concentration percentage by volume of germanium (Ge %2) in a silicon germanium (SiGe) material layer. In some embodiments, the second concentration percentage by volume of germanium (Ge %2) may be within a second range of concentrations by volume where 25%≤Ge %2≤45%. According to some embodiments, the second concentration percentage by volume of germanium (Ge %2) represents a constant concentration level of germanium (Ge) throughout the structures of the second epitaxial growth layer 601. In other embodiments, the second concentration percentage of germanium (Ge %2) represents a gradient of concentration levels of germanium (Ge) throughout the structure of the second epitaxial growth layer 601. For example, the structure of the second epitaxial growth layer 601 may have a concentration level gradient for which the concentration level of germanium increases as a distance from the substrate 101 increases. As such, the gradient of concentration levels of germanium (Ge) may go from 25% at the bottom of the second epitaxial growth layer 601 which interfaces the first epitaxial growth layer 501 to about 45% at the top of the second epitaxial growth layer 601. In such embodiments, the concentration level gradient may be formed during growth by tuning one or more of flow rates of precursors used to form the second epitaxial growth layer 601 and increase the percentage concentration of germanium during deposition.

In some embodiments, the second epitaxial growth layer 601 is epitaxially grown using any of the deposition techniques suitable for forming the first epitaxial growth layer 501 (e.g., epitaxial growth, VPE, MBE, combinations, or the like). In addition, the deposition process may be conducted at a process temperature between about 400° C. and about 800° C., in accordance with some embodiments. Furthermore, the deposition process may be conducted at a process pressure of between about 1 torr and about 760 torr. However, any suitable temperature and pressure may be utilized to form the second epitaxial growth layer 601. In some embodiments, the deposition process is controlled such that the second epitaxial growth layer 601 is epitaxially grown from the first epitaxial growth layer 501 to fill the remaining space within the first openings 301 to a second height H2 in a bottom-up process. According to some embodiments, the second height H2 is a height between about 30 nm and about 60 nm and the fifth thickness Th5 is thickness between about 10 nm and about 20 nm. However, any suitable height and thickness may be used.

According to embodiments, the second epitaxial growth layer 601 is heavily doped as compared to the lightly doped materials of the first epitaxial growth layer 501. In some embodiments, the second epitaxial growth layer 601 are heavily doped (e.g., a concentration by volume of between about $8 \times 10^{20}$ cm$^{-3}$ and about $1.2 \times 10^{21}$ cm$^{-3}$ with an n-type dopant (e.g., boron (B)). However, any suitable n-type dopant may be utilized.

The dopants of the second epitaxial growth layer 601 may be placed during the growth of the second epitaxial growth layer 601, in accordance with some embodiments. For example, the n-type dopant may be placed in situ as the second epitaxial growth layer 601 is epitaxially grown. In other embodiments, the dopants may be placed in the second epitaxial growth layer 601 after formation using, for example, a suitable dopant implantation technique. However, any suitable process for placing the dopants within the second epitaxial growth layer 601 may be utilized, and all such processes are fully intended to be included within the scope of the embodiments. Furthermore, separate anneal processes and/or a combined anneal process may be performed to activate the dopants within the first epitaxial growth layer 501 and second epitaxial growth layer 601.

Figure 7:
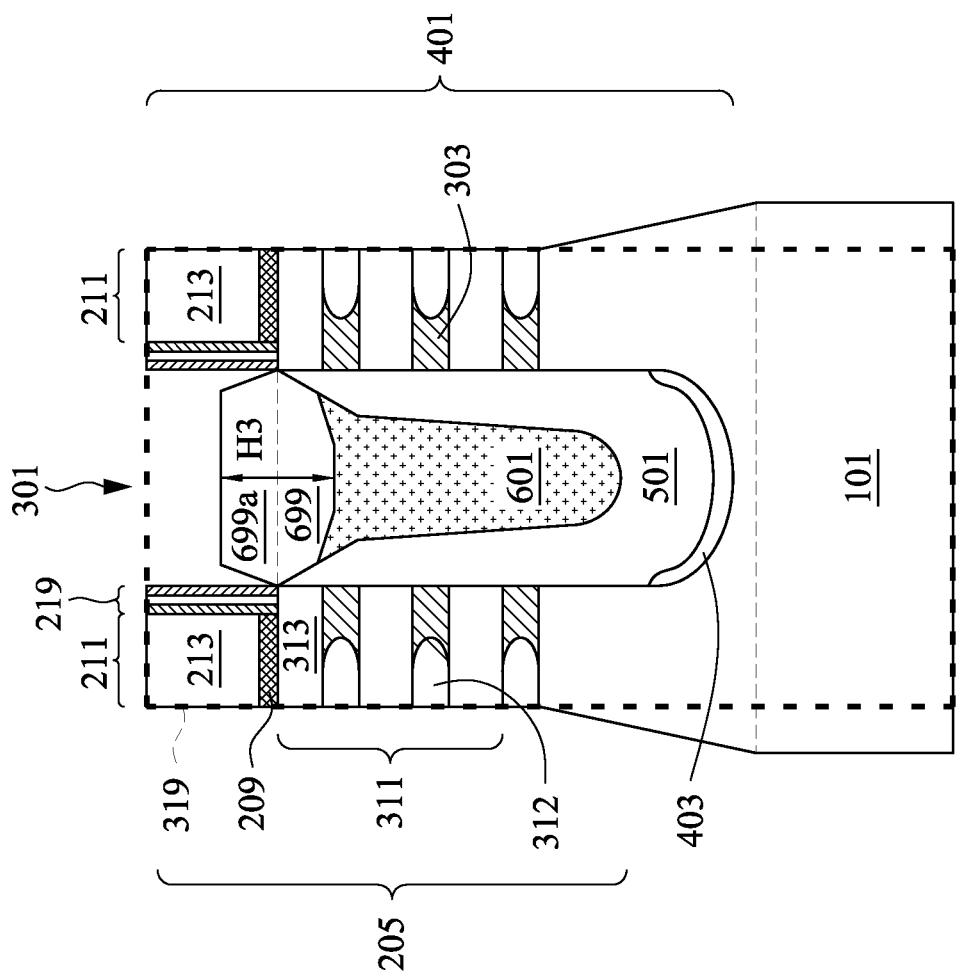

FIG. 7 illustrates the formation of the third epitaxial growth layer 699 in the first openings 301, according to some embodiments. Once the second epitaxial growth layer 601 has been formed, the third epitaxial growth layer 699 may be formed over the second epitaxial growth layer 601. According to some embodiments, the third epitaxial growth layer 699 is formed using any of the deposition process and precursors for silicon (Si) and germanium (Ge) suitable for forming the first epitaxial growth layer 501 as set forth above. In some embodiments, the precursors used for the third epitaxial growth layer 699 are the same precursors used for the second epitaxial growth layer 601. According to some embodiments, the third epitaxial growth layers 699 are formed using precursors such as DCS and germane (GeH$_4$). However, other materials such as those materials suitable for forming the second epitaxial growth layer 601 such as hydrochloric acid (HCl), phosphane (PH$_3$), arsane (AsH$_3$), diborane (B$_2$H$_6$), the like, or combinations thereof may also be used. In some embodiments, the third epitaxial growth layer 699 is doped with an n-type dopant (e.g., boron (B)). However, other dopants may also be utilized.

According to some embodiments, the third epitaxial growth layer 699 is formed as a third concentration percentage by volume of germanium (Ge %3) in a silicon germanium (SiGe) material layer. In some embodiments, the third concentration percentage by volume of germanium (Ge %3) may be within a third range of concentrations by volume where 45%≤Ge %3≤65%. According to some embodiments, the third concentration percentage by volume of germanium (Ge %3) represents a constant concentration level of germanium (Ge) throughout the structures of the third epitaxial growth layer 699. In other embodiments, the third concentration percentage of germanium (Ge %3) represents a gradient of concentration levels of germanium (Ge) throughout the structure of the third epitaxial growth layer 699. For example, the structure of the third epitaxial growth layer 699 may have a concentration level gradient for which the concentration level of germanium increases as a distance from the substrate 101 increases. As such, the gradient of concentration levels of germanium (Ge) may go from 45% at the bottom of the third epitaxial growth layer 69 which interfaces the second epitaxial growth layer 601 to about 65% at the top of the third epitaxial growth layer 699. In such embodiments, the concentration level gradient may be formed during growth by tuning one or more of flow rates of precursors used to form the third epitaxial growth layer 699 and increase the percentage concentration of germanium during deposition.

In some embodiments, the third epitaxial growth layer 699 is epitaxially grown using any of the deposition techniques suitable for forming the second epitaxial growth layer 601 (e.g., epitaxial growth, VPE, MBE, combinations, or the like). In addition, the deposition process may be conducted at a process temperature between about 400° C. and about 800° C., in accordance with some embodiments. Furthermore, the deposition process may be conducted at a process pressure of between about 1 torr and about 760 torr. However, any suitable temperature and pressure may be utilized to form the third epitaxial growth layer 699. In some embodiments, the deposition process is controlled such that the third epitaxial growth layer 699 is epitaxially grown from the second epitaxial growth layer 601 to fill the remaining space within the first openings 301 to a third height H3 in a bottom-up process. According to some embodiments, the third height H3 is a height between about 5 nm and about 7 nm. However, any suitable height and thickness may be used. According to some embodiments, an upper portion 699a of the third epitaxial growth layer 699 may be formed with optional faceted shapes between the upper spacers 219.

According to embodiments, the third epitaxial growth layer 699 is heavily doped or even more heavily doped as compared to the heavily doped materials of the second epitaxial growth layer 601. In some embodiments, the third epitaxial growth layers 699 are more heavily doped (e.g., a concentration by volume of between about $8 \times 10^{20}$ cm$^{-3}$ and about $1.2 \times 10^{21}$ cm$^{-3}$ with an n-type dopant (e.g., boron (B)). However, any suitable n-type dopant may be utilized. In some embodiments, the dopant concentration of the third epitaxial growth layer 699 is the same as the dopant concentration of the second epitaxial growth layer 601. In some other embodiments, the dopant concentration of the third epitaxial growth layer 699 is greater than the dopant concentration of the second epitaxial growth layer 601.

The dopants of the third epitaxial growth layer 699 may be placed during the growth of the third epitaxial growth layer 699, in accordance with some embodiments. For example, the n-type dopant may be placed in situ as the third epitaxial growth layer 699 is epitaxially grown. In other embodiments, the dopants may be placed in the third epitaxial growth layer 699 after formation using, for example, a suitable dopant implantation technique. However, any suitable process for placing the dopants within the third epitaxial growth layer 699 may be utilized, and all such processes are fully intended to be included within the scope of the embodiments. Furthermore, separate anneal processes and/or a combined anneal process may be performed to activate the dopants within the first epitaxial growth layer 501, the second epitaxial growth layer 601, and the third epitaxial growth layer 699. As such, the multilayer source/drain region 491 is formed within the first opening 301 and is ready for further processing.

Figure 8:
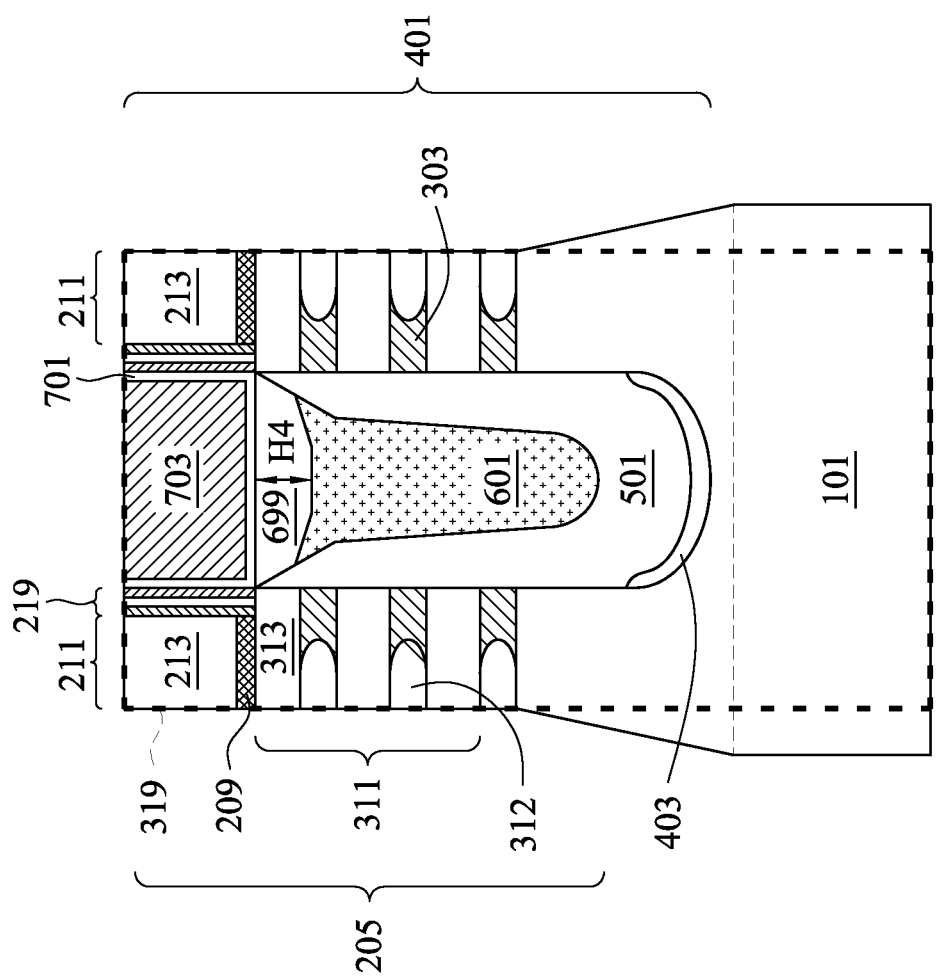

FIG. 8 illustrates a cross-sectional view of an intermediate step in preparation for the eventual formation of the gate contacts and the source/drain contacts of the semiconductor device, in accordance with some embodiments. In particular, FIG. 8 illustrates the formation of a contact etch stop layer 701 and a first interlayer dielectric layer 703, in accordance with some embodiments. Once the material of the third epitaxial growth layer 699 has been deposited, an optional etching process (e.g., wet etch) may be performed to recess and/or planarize the third epitaxial growth layer 699. As such, the third epitaxial growth layer 699 may be reduced to a fourth height H4 and at least some of the upper portion 699a may be removed. The fourth height H4 may be a height of between about 2 nm and about 5 nm. However, any suitable height may be used.

Once the third epitaxial growth layer 699 has been formed, the contact etch stop layer 701 is formed over the multilayer source/drain regions 401, along sidewalls of the upper spacers 219, and over the top of the materials exposed on the top of the intermediate structure. The contact etch stop layer 701 functions as an etch stop layer in a subsequent etching process, and may comprise a suitable material such as silicon nitride (SiN), silicon oxynitride (SiON), silicon carbon nitride (SiCN), combinations thereof, or the like, and may be formed by a suitable formation method such as chemical vapor deposition (CVD), physical vapor deposition (PVD), combinations thereof, or the like.

The first interlayer dielectric layer 703 is formed over the contact etch stop layer 701 and fills and/or overfills the remaining space in the first openings 301. The first interlayer dielectric layer 703 may comprise a material such as silicon dioxide, a low-k dielectric material (e.g., a material having a dielectric constant lower than silicon dioxide), such as silicon oxynitride, phosphosilicate glass (PSG), borosilicate glass (BSG), borophosphosilicate glass (BPSG), undoped silicate glass (USG), fluorinated silicate glass (FSG), organosilicate glasses (OSG), $SiO_xC_y$, Spin-On-Glass, Spin-On-Polymers, silicon carbon material, a compound thereof, a composite thereof, the like, or a combination thereof, although any suitable dielectrics may be used. The first interlayer dielectric layer 703 may be formed using a process such as plasma enhanced chemical vapor deposition (PECVD), although other processes, such as low pressure chemical vapor deposition (LPCVD), may also be used.

Once formed, the first interlayer dielectric layer 703 and the contact etch stop layer 701 may be planarized with the dummy gate electrode 213 and the upper spacers 219 using a planarization process such as chemical mechanical planarization (CMP). However, any suitable planarization process may be utilized. Furthermore, any remaining portions of the first hard mask and/or the second hard mask not previously removed may be removed during the planarization process of the first interlayer dielectric layer 703. According to some embodiments, one or more etching processes and/or the chemical mechanical planarization (CMP) may be utilized to remove any remaining portions of the first hard mask and the second hard mask. As such, the dummy gate electrode 213 is exposed after the planarization process.

Figure 9:
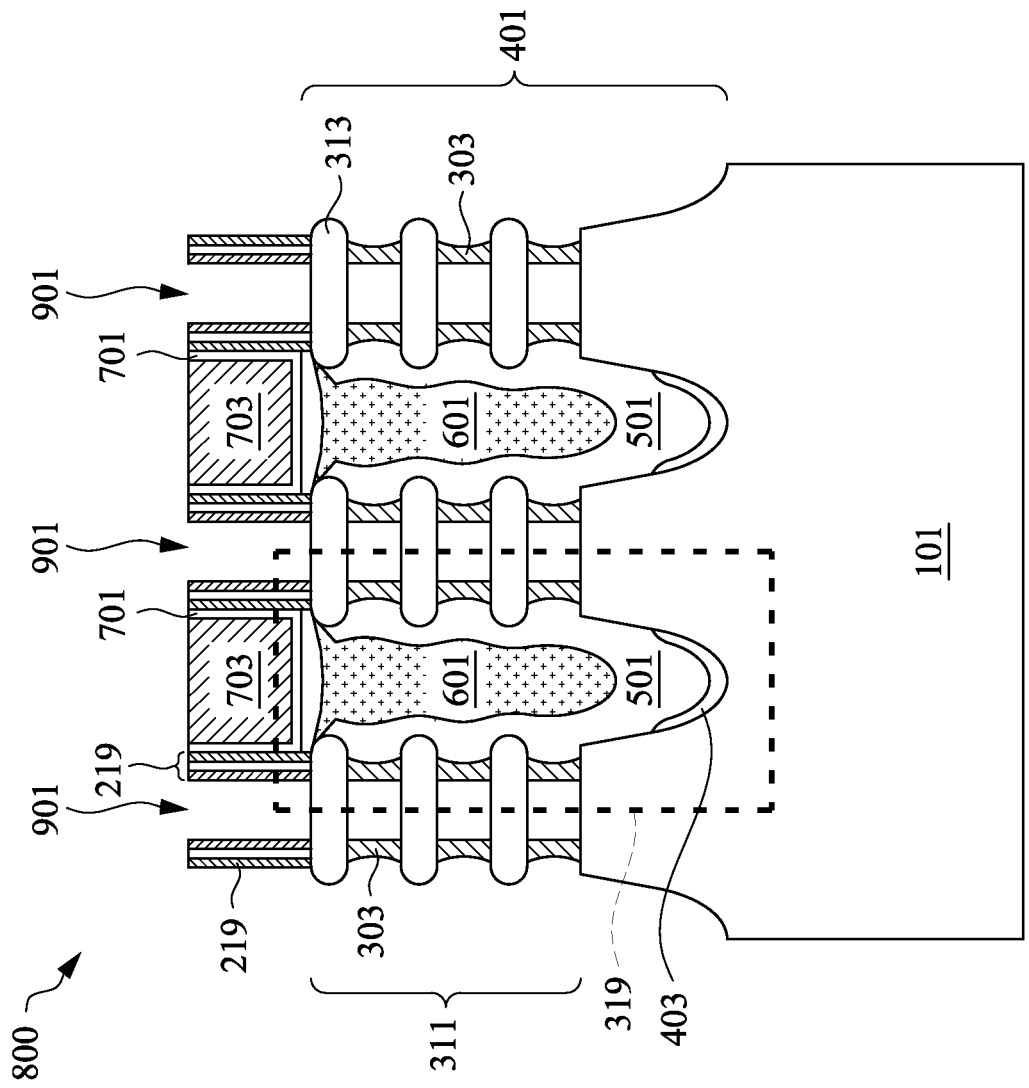
FIG. 9 illustrates a cross-sectional view of a dummy gate stack removal process in an initial step in forming a gate electrode of the semiconductor device, in accordance with some embodiments.

FIG. 9 illustrates a cross-sectional view of an intermediate step in forming a gate electrode of the semiconductor device, in accordance with some embodiments. In particular, FIG. 9 illustrates the removal of the dummy gate electrodes 213, the dummy gate dielectric 209, and the sacrificial layers 312 in preparation for the eventual formation of a gate electrode, in accordance with some embodiments.

Once exposed, the dummy gate electrodes 213 may be removed in order to expose the underlying dummy gate dielectric 209. In an embodiment the dummy gate electrodes 213 are removed using, e.g., one or more wet or dry etching processes that utilize etchants that are selective to the material of the dummy gate electrodes 213. However, any suitable removal process may be utilized.

Once the dummy gate dielectric 209 has been exposed, the dummy gate dielectric 209 is removed to expose the underlying multilayer channels regions in the patterned multilayer stacks 205. In an embodiment the dummy gate dielectric 209 may be removed using, e.g., a wet etching process that utilizes etchants that are selective to the material of the dummy gate dielectric 209 and substantially less-selective or non-selective to the underlying materials of the nanostructures 313 and the sacrificial layers 312, although any suitable etching process may be utilized.

Once the dummy gate dielectric 209 has been removed, the sides of the sacrificial layers 312 previously covered by the dummy gate dielectric 209 are exposed within second openings 901. As such, the sacrificial layers 312 may be removed in a wire release process step. The wire release process step may also be referred to as a sheet release process step, a sheet formation process step, a nanosheet formation process step or a wire formation process step. In an embodiment the sacrificial layers 312 may be removed using a wet etching process that selectively removes the material of the sacrificial layers 312 (e.g., silicon germanium (SiGe)) without significantly removing the material of the substrate 101 and the material of the nanostructures 313 (e.g., silicon (Si)). However, any suitable removal process may be utilized.

For example, in an embodiment, an etchant such as a high temperature HCl may be used to selectively remove the material of the sacrificial layers 312 (e.g., SiGe) without substantively removing the material of the substrate 101 and/or the material of the nanostructures 313 (e.g., Si). Additionally, the wet etching process may be performed at a temperature of between about 400° C. and about 600° C., and for a time of between about 100 seconds and about 600 seconds. However, any suitable etchant, process parameters, and time can be utilized.

By removing the material of the sacrificial layers 312, the sides of the nanostructures 313 are exposed. The nanostructures 313 are separated from each other by the inner spacers 303. According to some embodiments, the nanostructures 313 are separated by a spacing of between about 5 nm and about 15 nm. The nanostructures 313 comprise the channel regions between opposite ones of the multilayer source/drain regions 401 and have a channel length of between about 5 nm and about 180 nm and a channel width of between about 8 nm and about 100 nm. In an embodiment the nanostructures 313 are formed to have the same thicknesses as the original thicknesses of the second layers 123 such as, of between about 5 nm and about 10 nm, although the etching processes may also be utilized to reduce the thicknesses.

Additionally, although FIG. 9 illustrates the formation of three of the nanostructures 313 in the nanostructure stacks 311, any suitable number of the nanostructures 313 may be formed from the nanosheets provided in the multilayer stack 119. For example, the multilayer stack 119 may be formed to include any suitable number of the first layers 121 and any suitable number of the second layers 123. As such, a multilayer stack 119 comprising fewer first layers 121 and fewer second layers 123, after removal of the sacrificial layers 312, forms one or two of the nanostructures 313. Whereas, a multilayer stack 119 comprising many of the first layers 121 and many of the second layers 123, after removal of the sacrificial layers 312, forms four or more of the nanostructures 313.

Figure 10:
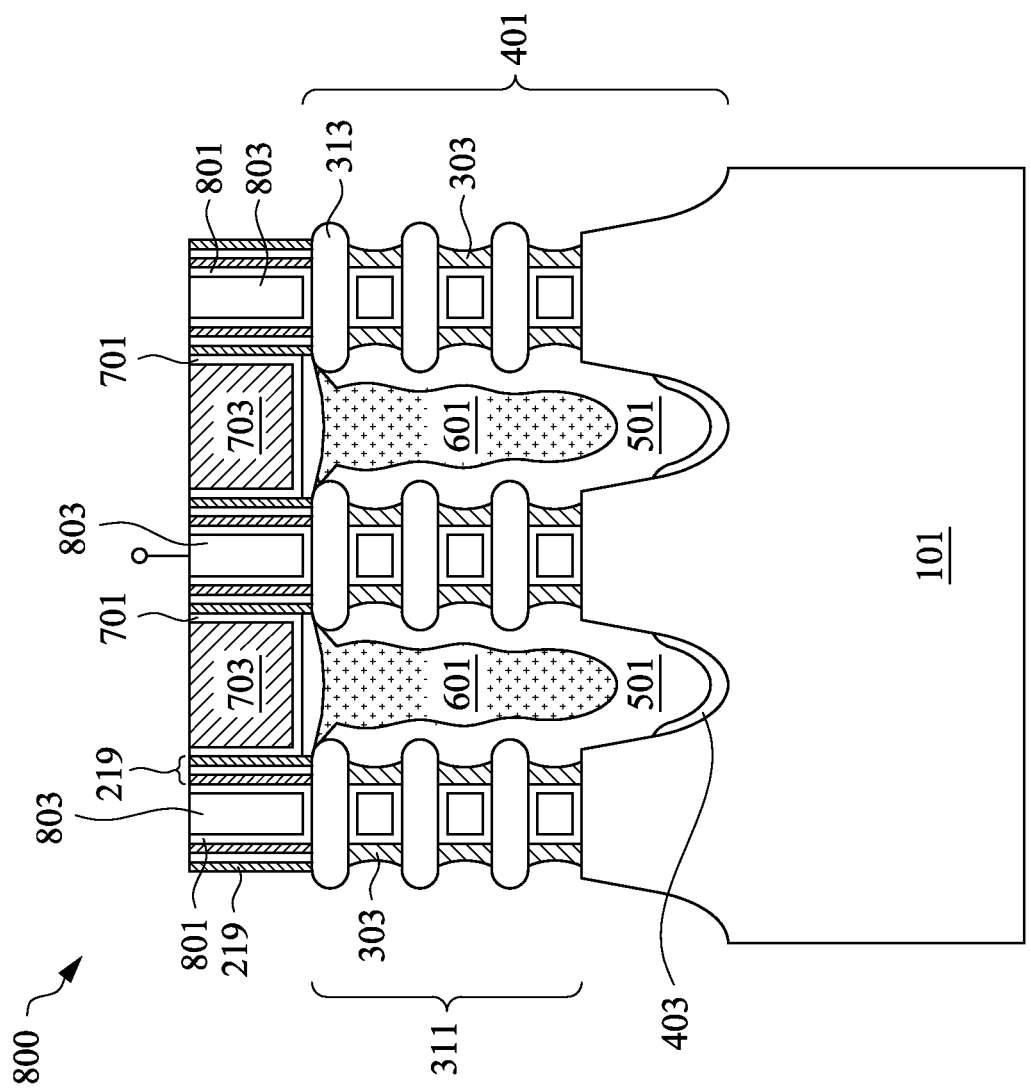
FIG. 10 illustrates a cross-sectional view of a formation of a gate dielectric layer and gate electrodes in a first semiconductor device, in accordance with some embodiments.

FIG. 10 illustrates a cross-sectional view of a first semiconductor device 800, in accordance with some embodiments. In particular, FIG. 10 illustrates the formation of a gate dielectric 801 and gate electrodes 803 within the second openings 901, according to some embodiments.

In an embodiment the gate dielectric 801 comprises a high-k material (e.g., K>=9) such as $Ta_2O_5$, $Al_2O_3$, Hf oxides, Ta oxides, Ti oxides, Zr oxides, Al oxides, La oxides (e.g., $HfO_2$, HfSiO, HfSiON, HfTaO, HfTiO, HfZrO, LaO, ZrO, TiO), combinations of these, or the like, deposited through a process such as atomic layer deposition, chemical vapor deposition, or the like. In some embodiments, the gate dielectric 801 comprises a nitrogen doped oxide dielectric that is initially formed prior to forming a metal content high-K (e.g., K value>13) dielectric material. The gate dielectric 801 may be deposited to a thickness of between about 1 nm and about 3 nm, although any suitable material and thickness may be utilized. As illustrated, the gate dielectric 801 wraps around the nanostructures 313, thus forming gate-all-around channels between the second epitaxial growth layer 601.

Once the gate dielectric 801 has been formed, the gate electrodes 803 are formed to surround the nanostructures 313 and serve as gate-all-around electrodes of the first semiconductor device 800. In some embodiments, the gate electrodes 803 are formed using multiple layers, each layer deposited sequentially adjacent to each other using a highly conformal deposition process such as atomic layer deposition, although any suitable deposition process may be utilized. According to some embodiments, the gate electrodes 803 may comprise a capping layer, a barrier layer, an n-metal work function layer, a p-metal work function layer, and a fill material.

The capping layer may be formed adjacent to the gate dielectric 801 and may be formed from a metallic material such as TaN, Ti, TiAlN, TiAl, Pt, TaC, TaCN, TaSiN, Mn, Zr, TiN, Ru, Mo, WN, other metal oxides, metal nitrides, metal silicates, transition metal-oxides, transition metal-nitrides, transition metal-silicates, oxynitrides of metals, metal aluminates, zirconium silicate, zirconium aluminate, combinations of these, or the like. The metallic material may be deposited using a deposition process such as atomic layer deposition, chemical vapor deposition, or the like, although any suitable deposition process may be used.

The barrier layer may be formed adjacent the capping layer, and may be formed of a material different from the capping layer. For example, the barrier layer may be formed of a material such as one or more layers of a metallic material such as TiN, TaN, Ti, TiAlN, TiAl, Pt, TaC, TaCN, TaSiN, Mn, Zr, Ru, Mo, WN, other metal oxides, metal nitrides, metal silicates, transition metal-oxides, transition metal-nitrides, transition metal-silicates, oxynitrides of metals, metal aluminates, zirconium silicate, zirconium aluminate, combinations of these, or the like. The barrier layer may be deposited using a deposition process such as atomic layer deposition, chemical vapor deposition, or the like, although any suitable deposition process may be used.

The n-metal work function layer may be formed adjacent to the barrier layer. In an embodiment the n-metal work function layer is a material such as W, Cu, AlCu, TiAlC, TiAlN, TiAl, Pt, Ti, TiN, Ta, TaN, Co, Ni, Ag, Al, TaAl, TaAlC, TaC, TaCN, TaSiN, Mn, Zr, other suitable n-type work function materials, or combinations thereof. For example, the first n-metal work function layer may be deposited utilizing an atomic layer deposition (ALD) process, CVD process, or the like. However, any suitable materials and processes may be utilized to form the n-metal work function layer.

The p-metal work function layer may be formed adjacent to the n-metal work function layer. In an embodiment, the first p-metal work function layer may be formed from a metallic material such as W, Al, Cu, TiN, Ti, TiAlN, TiAl, Pt, Ta, TaN, Co, Ni, TaC, TaCN, TaSiN, $TaSi_2$, $NiSi_2$, Mn, Zr, $ZrSi_2$, TaN, Ru, AlCu, Mo, $MoSi_2$, WN, other metal oxides, metal nitrides, metal silicates, transition metal-oxides, transition metal-nitrides, transition metal-silicates, oxynitrides of metals, metal aluminates, zirconium silicate, zirconium aluminate, combinations of these, or the like. Additionally, the p-metal work function layer may be deposited using a deposition process such as atomic layer deposition, chemical vapor deposition, or the like, although any suitable deposition process may be used.

Once the p-metal work function layer has been formed, the fill material is deposited to fill a remainder of the opening. In an embodiment the fill material may be a material such as tungsten, Al, Cu, AlCu, W, Ti, TiAlN, TiAl, Pt, TaC, TaCN, TaSiN, Mn, Zr, TiN, Ta, TaN, Co, Ni, combinations of these, or the like, and may be formed using a deposition process such as plating, chemical vapor deposition, atomic layer deposition, physical vapor deposition, combinations of these, or the like. However, any suitable material may be utilized.

Once the second openings 901 left behind by the removal of the dummy gate electrodes 213 have been filled, the materials of the gate electrodes 803 and the gate dielectric 801 may be planarized in order to remove the materials of the gate electrodes 803 and the gate dielectric 801 that is outside of the openings. In a particular embodiment the removal may be performed using a planarization process such as chemical mechanical polishing, although any suitable planarization and removal process may be utilized.

Once formed, an optional recessing process may be performed to recess the gate electrodes 803 below the planarized surfaces of the first interlayer dielectric layer 703. The optional recessing process may be performed using an etching process such as a wet etch, a dry etch, combinations, or the like. Once recessed, optional gate caps (not shown) may be formed in the recesses by initially depositing a dielectric material over the gate electrodes 803 to fill and/or overfill the recesses. In some embodiments, the optional gate caps are formed using a dielectric material such as a silicon nitride (SiN), oxide (OX), silicon oxynitride (SiON), silicon oxycarbonitride (SiOCN), silicon carbonitride (SiCN), or the like. According to some embodiments, the optional gate caps are formed using a metal oxide of materials such as zirconium (Zr), halfnium (Hf), aluminium (Al), or the like. Furthermore, the optional gate caps may be formed using a suitable deposition process such as chemical vapor deposition (CVD), atomic layer deposition (ALD), physical vapor deposition (PVD), combinations of these, or the like. However, any suitable materials and deposition processes may be utilized. Once deposited, the optional gate caps, the upper spacers 219, the contact etch stop layer 701, and the first interlayer dielectric layer 703 may be planarized using a planarization process such as a chemical mechanical polishing process.

Figure 11:
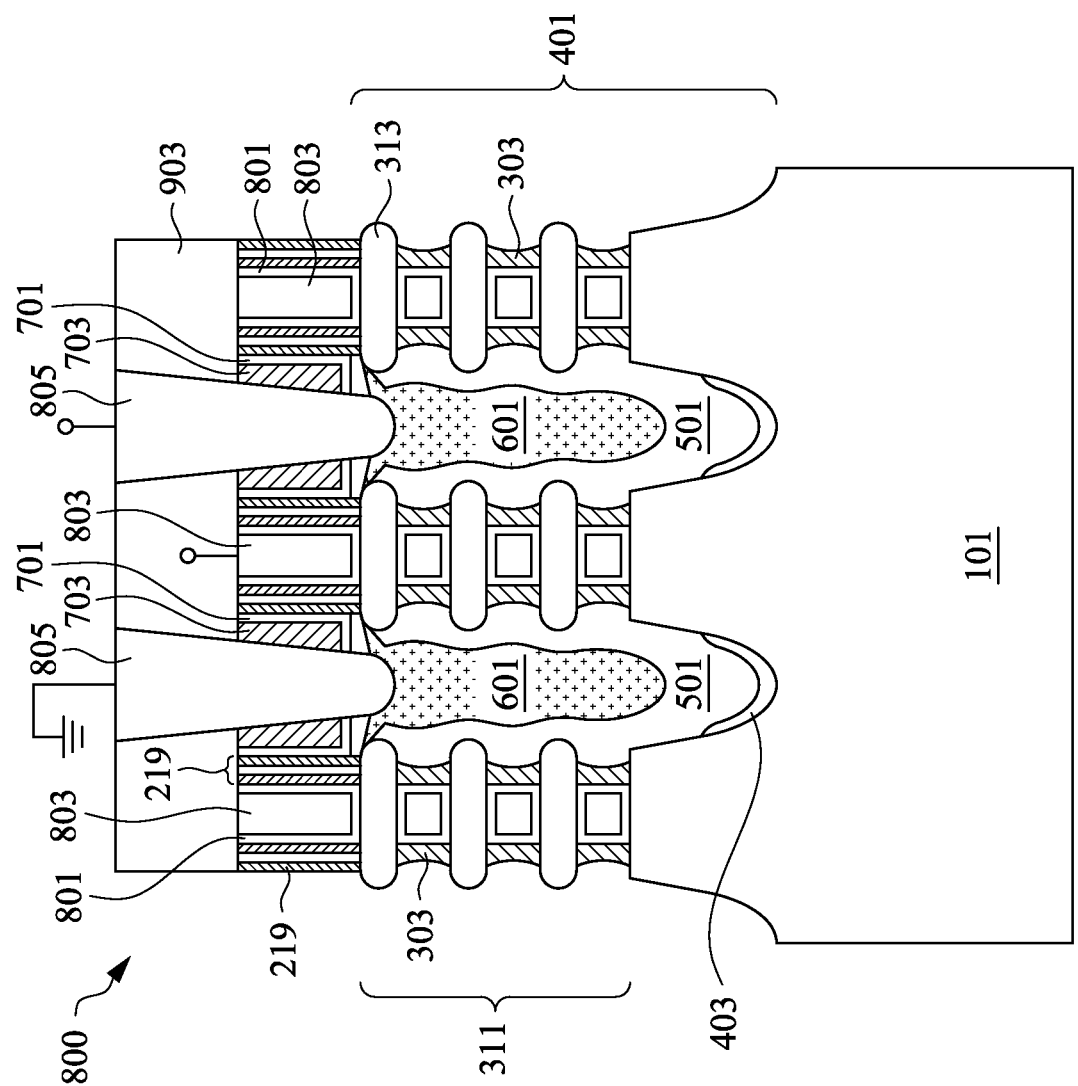
FIG. 11 illustrates cross-sectional view of forming a second interlayer dielectric layer and source/drain electrodes in the first semiconductor device, in accordance with some embodiments.

FIG. 11 illustrates the formation of source/drain contacts 805 for connectivity to the multilayer source/drain regions 401, in accordance with some embodiments. Once the gate electrodes 803 have been formed, the source/drain contacts 805 may be formed by initially forming a second interlayer dielectric layer 903 over the planar surfaces of the gate electrodes 803, the upper spacers 219, contact etch stop layer 701 and the first interlayer dielectric layer 703. Once the second interlayer dielectric layer 903 has been formed, openings may be formed through the second interlayer dielectric layer 903, the first interlayer dielectric layer 703 and the contact etch stop layer 701 to make electrical connection to the multilayer source/drain regions 401. In an embodiment the source/drain contacts 805 may be formed by initially forming openings through the second interlayer dielectric layer 903, the first interlayer dielectric layer 703 and the contact etch stop layer 701 in order to expose the multilayer source/drain regions 401. The openings may be formed using, e.g., a suitable photolithographic masking and etching process.

According to some embodiments, an optional silicidation process may be performed using appropriate materials such as titanium, nickel, cobalt, or erbium in order to reduce the Schottky barrier height of the source/drain contacts 805. However, other metals, such as platinum, palladium, and the like, may also be used for the optional silicidation process. In some embodiments, the optional silicidation process is performed using a blanket deposition of an appropriate metal layer in the openings and over the exposed areas of the multilayer source/drain regions 401. The blanket deposition is followed by an annealing step which causes the metal layer to react with the underlying exposed material (e.g., silicon) of the multilayer source/drain regions 401. Unreacted metal is then removed, such as with a selective etch process. According to some embodiments, the optional silicide contacts are formed to a thickness of between about 5 nm and about 50 nm. However, any suitable thickness may be used.

The source/drain contacts 805 may be formed by depositing a conductive material such as W, Al, Cu, Co, Ti, Ta, Ru, TiN, TiAl, TiAlN, TaN, TaC, NiSi, CoSi, combinations of these, or the like, into the openings and over the exposed areas of the multilayer source/drain regions 401 or over the optional silicide contacts (if present). The conductive material may be deposited using a process such as sputtering, chemical vapor deposition, electroplating, electroless plating, or the like, to fill and/or overfill the openings. Once filled or overfilled, any conductive material deposited outside of the openings may be removed using a planarization process such as chemical mechanical polishing (CMP). However, any suitable deposition process and planarization process may be utilized.

Further interlayer dielectric layers (not individually illustrated) and conductive features (also not individually illustrated) may be formed over the gate electrodes 803 and/or the source/drain contacts 805 to provide further external connectivity to the first semiconductor device 800. Examples of further conductive features include but are not limited to, conductive vias, contact plugs, redistribution layers, contact traces, integrated passive devices, under bump metallization layers, and external contacts. However, any suitable dielectric layers and/or conductive features may be utilized and all such features are fully intended to be included within the scope of the embodiments.

Figure 12:
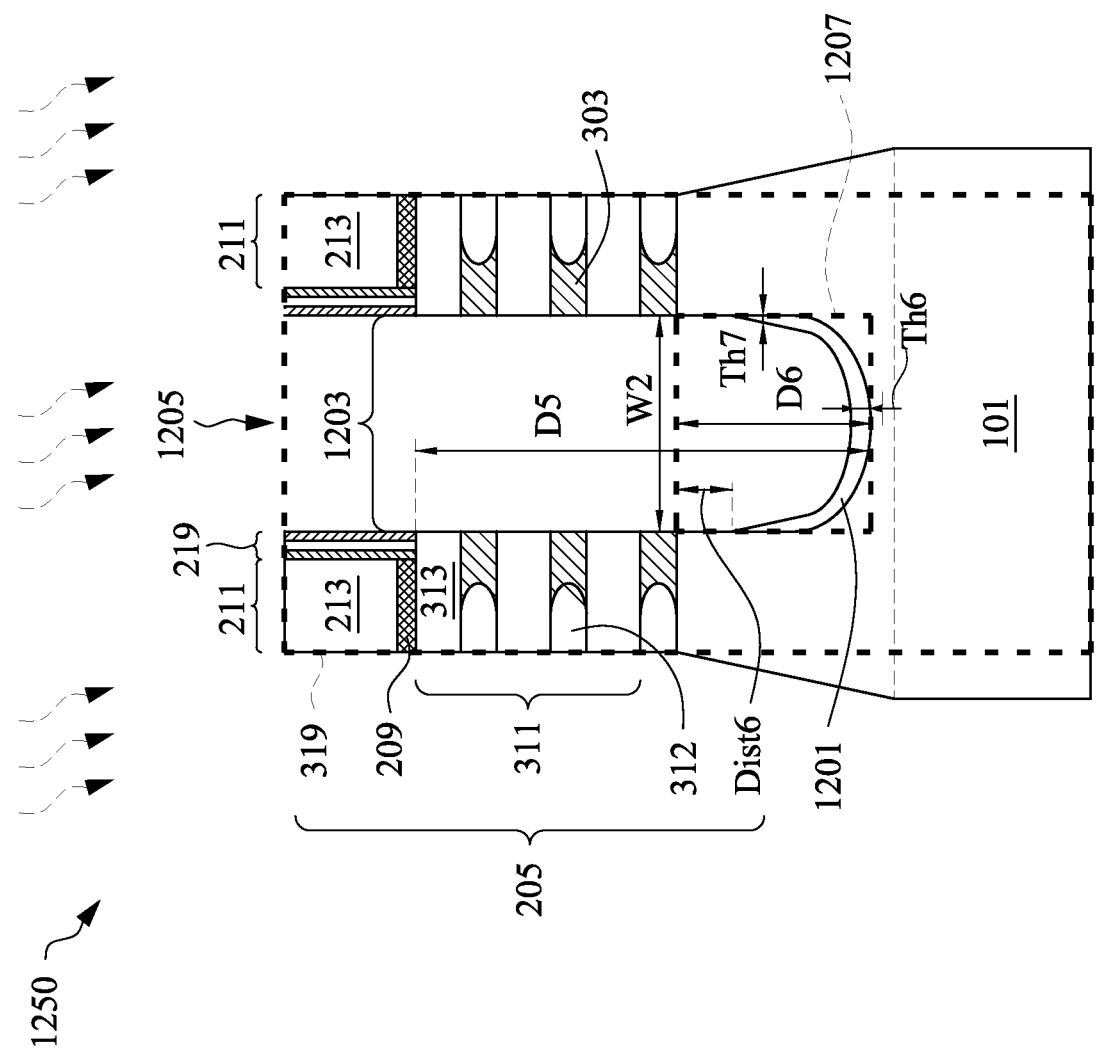
FIGS. 12 and 13 illustrate cross-sectional views of intermediate steps of forming a second multilayer source/drain region of the semiconductor device, in accordance with some other embodiments.

FIG. 12, in accordance with other embodiments, illustrates a cross-sectional view along cutline A-A of a formation of a second source/drain barrier layers 1201 in an intermediate step of forming a second multilayer source/drain region 1203 of the semiconductor device. According to some embodiments, the second source/drain barrier layers 1201 may be formed as a dielectric layer at the bottom of a second opening 1205.

In particular, FIG. 12 illustrates the formation of the second opening 1205 as an initial step of forming the second multilayer source/drain region 1203, in accordance with some embodiments. According to some embodiments, the second opening 1205 may be formed by using the upper spacers 219 as masks and performing a second recess etching process (not shown) to selectively remove the materials of the patterned multilayer stacks 205 and/or the substrate 101 in desired locations of the second multilayer source/drain regions 1203. As such the second openings 1205 divide the patterned multilayer stacks 205 into the series of nanostructure stacks 311 within the multilayer channel regions underlying the dummy gate stacks 211. The nanostructure stacks 311 comprise the first layers 121 (relabeled sacrificial layers 312 in FIG. 12) and the second layers 123 (relabeled nanostructures 313 in FIG. 12).

In some embodiments, the second openings 1205 may extend from the tops of the series of nanostructure stacks 311 and into the substrate 101 to a fifth depth D5 of between about 40 nm and about 70 nm. According to some embodiments, the second opening 1205 is formed with a second recess profile 1207 having a shallow concave rounded shape. In some embodiments, the second recess profile 1207 has the second width W2 at the top of the substrate 101 and extends into the substrate 101 to a sixth depth D6. The shallow concave rounded shape of the second recess profile 1207 may be formed, according to some embodiments, using an anisotropic dry etch with a plasma source ($CF_4$) and a power bias. As such, the second recess profile 1207 is formed to have the shallow concave rounded shape with the second width W2 at the top of substrate 101 and the sixth depth D6 of between about 10 nm and about 15 nm. However, any suitable shapes, widths, and depths may be utilized for the second recess profile 1207.

In some embodiments, the second source/drain barrier layers 1201 may be epitaxially grown in a second bottom-up deposition process 1250 forming at the bottom of the second openings 1205 and along sidewalls of the second openings 1205. According to some embodiments, the second source/drain barrier layer 1201 may be formed as a dielectric layer using materials such as silicon oxides ($SiO_x$), silicon oxycarbonitrides (SiOCN), silicon nitrides ($SiN_x$), combinations, or the like, at the bottom of the second openings 1205.

In a particular embodiment in which the second source/drain barrier layers 1201 comprise silicon oxide, the second source/drain barrier layers 1201 may be formed using precursors for silicon (Si) such as dichlorosilane ($SiH_2Cl_2$) which may also be referred to herein as DCS, silane ($SiH_4$), disilane ($Si_2H_6$), or the like, and an oxidizing agent such as oxygen, ozone, or the like. In some embodiments the silicon precursors may be flowed into a reaction chamber at a flow rate of between about 50 sccm and about 150 sccm. Additionally, the oxidizing precursor may be flowed (either simultaneously or sequentially) into the reaction chamber at a flow rate of between about 30 sccm and about 50 sccm. However, any suitable flow rates may be utilized.

According to some embodiments, the deposition process used to form the second source/drain barrier layer 1201 may be performed using a process temperature between about 700° C. and about 800° C. In addition, the deposition process used to form the second source/drain barrier layer 1201 may be performed using a process pressure between about 10 torr and about 50 torr, in accordance with some embodiments. The deposition process may be continued for a period of time of between about 200 seconds and about 500 seconds. Other deposition processes or process parameters may also be used.

According to some embodiments, the deposition process is continued until the second source/drain barrier layer 1201 is formed to a sixth thickness Th6 of between about 2 nm and about 5 nm at the bottom of the first opening 301. Additionally, the deposition process may be controlled such that the second source/drain barrier layer 1201 is formed to a seventh thickness Th7 of between about 2 nm and about 5 nm along the sidewalls of the second opening 1205. According to some embodiments, the second source/drain barrier layer 1201 may be formed with a second thickness ratio of the seventh thickness Th7 to the sixth thickness Th6 of between about 1:1 and about 1:10. However, any suitable thickness and ratio may be used. In some embodiments, the second source/drain barrier layer 1201 is formed along the sidewalls of the second opening 1205 to a point located the sixth distance Dist6 from the bottommost one of the sacrificial layers 312. However, any suitable distance may be used. In the illustrated embodiment, the second source/drain barrier layer 1201 is formed as a meniscus shaped structure at the bottom of the second opening 1205. However, the second multilayer source/drain regions 1203 may be formed to any suitable shaped structure.

Figure 13:
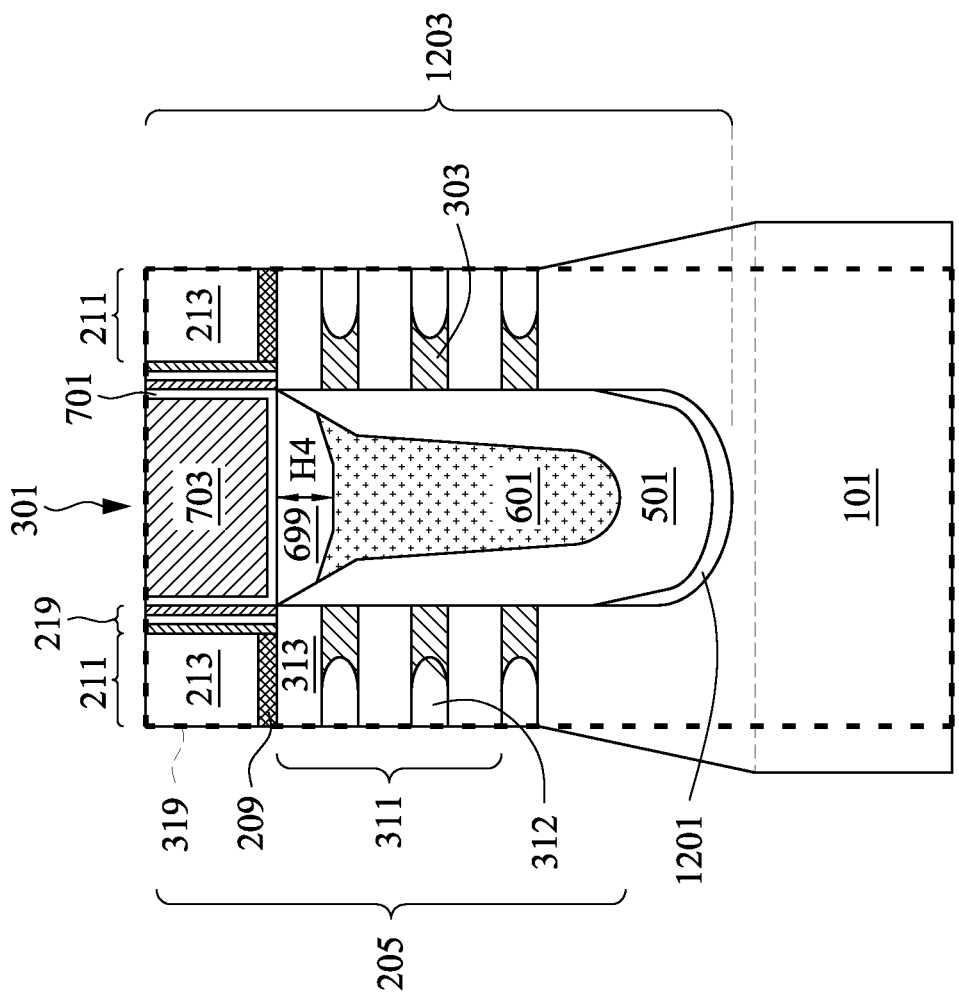

FIG. 13 illustrates a formation of the remaining layers of the second multilayer source/drain regions 1203 over the second source/drain barrier layer 1201 within the second openings 1205, according to some embodiments. For example, the first epitaxial growth layer 501 can be formed over the second source/drain barrier layers 1201, the second epitaxial growth layer 601 can be formed over the first epitaxial growth layer 501, the third epitaxial growth layer 699 can be formed over the second epitaxial growth layer 601 using any of the respective materials and processes set forth above to form the respective layers of the multilayer source/drain regions 401 within the first openings 301. As such, the second multilayer source/drain regions 1203 is formed within the second openings 1205. Once the second source/drain region 1203 has been formed, the contact etch stop layer 701 and the first interlayer dielectric layer 703 may be formed over the second multilayer source/drain regions 1203, as set forth above with regard to the multilayer source/drain region 401.

By utilizing the first source/drain barrier layer 403 or the second source/drain barrier layer 1201, the overall resistance of the device may be reduced. In particular, as the overall performance is degraded by stray capacitances within the device (e.g., capacitances between contact plugs and the gate electrode (Cco), capacitances between epitaxial regions and the gate electrode (Cof), overlap capacitances between the channels and the gate electrode (Cov), and junction capacitances between the source/drain regions and the underlying substrate (Cj)), a reduction of any of these capacitances will reduce the overall capacitances. As such, by inserting the first source/drain barrier layer 403 or the second source/drain barrier layer 1201, the junction capacitances may be reduced, thereby improving the overall performance of the device.

Figure 14:
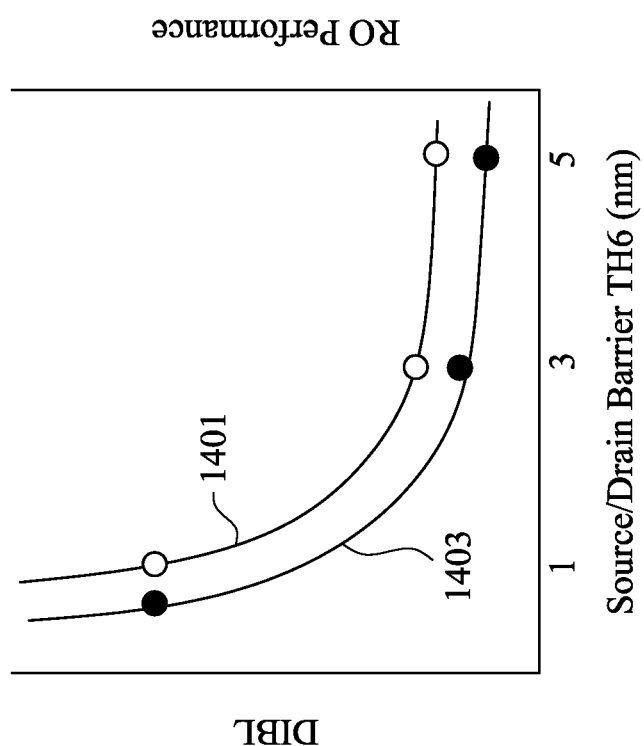
FIG. 14 illustrates a chart of DIBL effects and RO performance, in accordance with still further embodiments.

FIG. 14 illustrates this reduction in capacitance and resultant improvement of utilizing the second source/drain barrier layer 1201. As can be seen, by utilizing the second multilayer source/drain barrier region 1203 as described above, the drain induced barrier lowering curve (represented by the line labeled 1401) of a device with the second source/drain barrier layer 1201 may be shifted with respect to a device without the second source/drain barrier layer 1201 (represented by the line labeled 1403). As such, the output resistance (RO) performance may be increased.

In accordance with an embodiment, a method includes: forming an opening through a multilayer stack and into a substrate; depositing a barrier layer at a bottom of the opening, wherein after the depositing the barrier layer a top level of the barrier layer is below a bottom of the multilayer stack; forming a multilayer source/drain region over the barrier layer by depositing a first semiconductor material over the barrier layer; and forming a stack of nanostructures by removing sacrificial layers of the multilayer stack, the multilayer source/drain region being electrically coupled to the stack of nanostructures. In an embodiment, the method further includes: depositing the barrier layer in a bottom-up process along sidewalls of the opening, the top level remaining at least 2 nm below the bottom of the multilayer stack. In an embodiment the depositing the barrier layer comprises forming an undoped silicon material at the bottom of the opening. In an embodiment the forming the undoped silicon material forms the undoped silicon material to a thickness of at least 10 nm at the bottom of the opening. In an embodiment the depositing the barrier layer deposits a dielectric material. In an embodiment the depositing the barrier layer deposits the dielectric material to a thickness of no more than 5 nm at the bottom of the opening. In an embodiment the forming the multilayer source/drain region comprises forming the first semiconductor material with a first dopant concentration and depositing a second semiconductor material over the first semiconductor material, the second semiconductor material being formed with a second dopant concentration that is greater than the first dopant concentration.

In accordance with another embodiment a method includes: forming a multilayer structure over a substrate; forming an opening in the multilayer structure and the substrate, wherein after the forming the opening a first layer of the multilayer structure is exposed along a sidewall of the opening; forming a barrier structure along a bottom of the opening using a silicon precursor, wherein during the forming the barrier structure the barrier structure remains below a bottom of the multilayer structure; and forming a first layer of a source/drain region over the barrier structure by depositing a first semiconductor material and a first dopant using the silicon precursor and a first dopant precursor, the first layer of the source/drain region forming an interface with the multilayer structure. In an embodiment during the forming the barrier structure, a top of the barrier structure remains at least 2 nm below the first layer of the multilayer structure. In an embodiment after the forming the opening, the opening extends into the substrate at least 20 nm. In an embodiment the forming the barrier structure using the silicon precursor comprises performing a bottom up deposition of an undoped silicon material. In an embodiment the bottom up deposition is performed until the undoped silicon material is formed at a bottom of the opening to a thickness of at least 10 nm. In an embodiment the bottom up deposition is performed until a dielectric material is formed at a bottom of the opening to a thickness of at least 2 nm. In an embodiment the forming the barrier structure comprises using the silicon precursor and a second precursor.

In yet another embodiment, a semiconductor device includes: a multilayer channel over a substrate; a source/drain barrier structure embedded within the substrate, a top of the source/drain barrier structure being at least 2 nm below a level of the multilayer channel; and a multilayer source/drain region over and in contact with the source/drain barrier structure. In an embodiment the source/drain barrier structure comprises an undoped silicon material. In an embodiment a first thickness at a bottom of the source/drain barrier structure is greater than a second thickness at a top of the source/drain barrier structure. In an embodiment the first thickness of the source/drain barrier structure is at least 10 nm. In an embodiment the source/drain barrier structure comprises a dielectric material. In an embodiment the source/drain barrier structure has a thickness within a range of 2 nm and 5 nm.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
    forming an opening through a multilayer stack and into a substrate;
    depositing a barrier layer at a bottom of the opening, wherein after the depositing the barrier layer a top level of the barrier layer is below a bottom of the multilayer stack, wherein the barrier layer is meniscus shaped, wherein the depositing the barrier layer comprises performing a bottom-up deposition of an undoped silicon material, and wherein the bottom-up deposition is performed until the barrier layer has a first thickness adjacent to a bottom of the opening and a second thickness different from the first thickness, the second thickness being adjacent to a sidewall of the substrate, and wherein a ratio of the second thickness to the first thickness is between about 1:1 and about 1:10;
    forming a multilayer source/drain region over the barrier layer by depositing a first semiconductor material over the barrier layer; and
    forming a stack of nanostructures by removing sacrificial layers of the multilayer stack, the multilayer source/drain region being electrically coupled to the stack of nanostructures.

2. The method of claim 1, further comprising depositing the barrier layer in a bottom-up process along sidewalls of the opening, the top level remaining at least 2 nm below the bottom of the multilayer stack.

3. The method of claim 1, wherein the depositing the barrier layer comprises forming an undoped silicon material at the bottom of the opening.

4. The method of claim 3, wherein the forming the undoped silicon material forms the undoped silicon material to a thickness of at least 10 nm at the bottom of the opening.

5. The method of claim 1, wherein the depositing the barrier layer deposits a dielectric material.

6. The method of claim 5, wherein the depositing the barrier layer deposits the dielectric material to a thickness of no more than 5 nm at the bottom of the opening.

7. The method of claim 1, wherein the forming the multilayer source/drain region comprises forming the first semiconductor material with a first dopant concentration and depositing a second semiconductor material over the first semiconductor material, the second semiconductor material being formed with a second dopant concentration that is greater than the first dopant concentration.

8. A method comprising:
    forming a multilayer structure over a substrate;
    forming an opening in the multilayer structure and the substrate, wherein after the forming the opening a first layer of the multilayer structure is exposed along a sidewall of the opening;
    forming a barrier structure along a bottom of the opening using a silicon precursor, wherein during the forming the barrier structure the barrier structure remains below a bottom of the multilayer structure, wherein the forming the barrier structure using the silicon precursor comprises performing a bottom-up deposition of an undoped silicon material, and wherein the bottom-up deposition is performed until the barrier structure is formed at the bottom of the opening to a thickness of at least 2 nm, the barrier structure having a curved top surface, wherein each portion of the curved top surface is below a top-most portion of the substrate by a distance of at least 2 nm; and
    forming a first layer of a source/drain region over the barrier structure by depositing a first semiconductor material and a first dopant using the silicon precursor and a first dopant precursor, the first layer of the source/drain region forming an interface with the multilayer structure.

9. The method of claim 8, wherein during the forming the barrier structure, a top of the barrier structure remains at least 2 nm below the first layer of the multilayer structure.

10. The method of claim 9, wherein after the forming the opening, the opening extends into the substrate at least 20 nm.

11. The method of claim 10, wherein the bottom-up deposition is performed until the barrier structure is formed at the bottom of the opening to a thickness of at least 10 nm.

12. The method of claim 9, wherein the forming the barrier structure comprises using the silicon precursor and a second precursor.

13. The method of claim 9, wherein the barrier structure has a meniscus-shaped top surface.

14. The method of claim 9, wherein the barrier structure has a curved surface facing away from the substrate.

15. A semiconductor device comprising:
    a multilayer channel over a substrate;
    a source/drain barrier structure embedded within the substrate, a top of the source/drain barrier structure being at least 2 nm below a level of the multilayer channel, the source/drain barrier structure having a curved top surface, wherein each portion of the curved top surface is below a top-most portion of the substrate by a distance of at least 2 nm; and
    a multilayer source/drain region over and in contact with the source/drain barrier structure.

16. The semiconductor device of claim 15, wherein the source/drain barrier structure comprises an undoped silicon material.

17. The semiconductor device of claim 15, wherein a first thickness at a bottom of the source/drain barrier structure is greater than a second thickness at a top of the source/drain barrier structure.

18. The semiconductor device of claim 17, wherein the first thickness of the source/drain barrier structure is at least 10 nm.

19. The semiconductor device of claim 15, wherein the source/drain barrier structure comprises a dielectric material.

20. The semiconductor device of claim 19, wherein the source/drain barrier structure has a thickness within a range of 2 nm and 5 nm.

* * * * *